United States Patent
Edwards et al.

(10) Patent No.: US 7,160,105 B2
(45) Date of Patent: Jan. 9, 2007

(54) TEMPERATURE CONTROLLED VACUUM CHUCK

(75) Inventors: Charles O. Edwards, Pleasanton, CA (US); David Albertalli, San Jose, CA (US); Oleg Gratchev, San Jose, CA (US)

(73) Assignee: Litrex Corporation, Pleasanton, CA (US)

(*) Notice: Subject to any disclaimer, the term of this patent is extended or adjusted under 35 U.S.C. 154(b) by 160 days.

(21) Appl. No.: 10/479,078

(22) PCT Filed: May 31, 2002

(86) PCT No.: PCT/US02/17522

§ 371 (c)(1),
(2), (4) Date: Nov. 26, 2003

(87) PCT Pub. No.: WO02/099851

PCT Pub. Date: Dec. 12, 2002

(65) Prior Publication Data

US 2004/0238522 A1    Dec. 2, 2004

Related U.S. Application Data

(60) Provisional application No. 60/295,118, filed on Jun. 1, 2001, provisional application No. 60/295,100, filed on Jun. 1, 2001.

(51) Int. Cl.
*B23B 5/22*    (2006.01)
(52) U.S. Cl. ............................. 432/258; 279/3
(58) Field of Classification Search ............... 432/258; 219/228, 443.1; 118/724, 725, 50, 500; 279/3
See application file for complete search history.

(56) References Cited

U.S. PATENT DOCUMENTS

| | | | |
|---|---|---|---|
| 4,037,830 A | 7/1977 | Poluzzi et al. | |
| 4,795,518 A | 1/1989 | Meinel et al. | |
| 4,906,011 A * | 3/1990 | Hiyamizu et al. | 279/3 |
| 5,688,331 A * | 11/1997 | Aruga et al. | 118/725 |
| 5,738,165 A | 4/1998 | Imai | |
| 5,906,683 A * | 5/1999 | Chen et al. | 118/724 |
| 5,932,009 A * | 8/1999 | Kim et al. | 118/52 |
| 6,091,056 A | 7/2000 | Kannan et al. | |
| 6,296,712 B1 * | 10/2001 | Guo et al. | 118/728 |
| 6,375,176 B1 | 4/2002 | Getchel et al. | |
| 6,386,962 B1 * | 5/2002 | Gotkis et al. | 451/388 |
| 6,394,797 B1 | 5/2002 | Sugaya et al. | |
| 6,570,374 B1 * | 5/2003 | Moldavsky et al. | 324/158.1 |
| 6,752,703 B1 * | 6/2004 | Boyd et al. | 451/289 |
| 6,806,544 B1 * | 10/2004 | Liu | 257/414 |
| 6,824,666 B1 * | 11/2004 | Gandikota et al. | 205/183 |

* cited by examiner

OTHER PUBLICATIONS

International Search Report—PCT/US02/17522; ISA/US; mailed: Feb. 26, 2003.

*Primary Examiner*—Gregory Wilson
(74) *Attorney, Agent, or Firm*—Harness, Dickey & Pierce, P.L.L.

(57) ABSTRACT

A temperature controllable vacuum chuck includes a mounting bracket, a porous plate, a heating element, and a temperature sensor. The porous plate is mounted to the mounting bracket and is configured for securing a substrate to the vacuum chuck when air is suctioned out of the vacuum chuck. The heating element is attached to the bottom of the porous plate and uniformly heats the porous plate, thereby heating any substrate mounted on the vacuum chuck and enabling control over the cure rate of fluid materials deposited on the substrate. The temperature sensor measures the temperature of the porous plate so that it can be adjusted when desired with a user controllable temperature control component.

34 Claims, 14 Drawing Sheets

TEMPERATURE CONTROLLED VACUUM CHUCK

CROSS-REFERENCE TO RELATED APPLICATIONS

This application claims the benefit of U.S. Provisional Patent Application Ser. No. 60/295,118, entitled "Formation of Microstructures Using Piezo Deposition of Liquid Onto Substrate," filed Jun. 1, 2001, and U.S. Provisional Application Ser. No. 60/295,100, entitled Formation Of Printed Circuit Board Structures Using Piezo Deposition Of Liquid Onto Substrate, filed Jun. 1, 2001, each of which is incorporated herein by reference.

DISCUSSION OF THE INVENTION

The present invention relates to the field of vacuum chucks and, more specifically, to the field of vacuum chucks configured to secure substrates during printing or deposition procedures.

Manufacturers have developed various techniques for creating microstructures on substrates such as, for example, light-emitting diode (LED) display devices, liquid crystal display (LCD) devices, printed circuit boards (PCBs) and the like. The quality of such devices is dependent on several factors including the accuracy in which the fluid materials are positioned on the substrates and the resultant formation of the fluid materials once cured.

The formation of the fluid materials on the substrate can be particularly important when manufacturing display devices because the formation of the microstructures on a display can affect the transmission of light through the display and the ultimate quality of the display. One type of fluid manufacturing material contemplated for use in manufacturing display devices includes light-emitting polymers (LEPs). In recent years, it has been discovered that LEPs can be used in diodes to generate visible light of different wavelengths. LEPs are particularly desirable because they are capable of providing full-spectrum color and require very little power to emit a substantial amount of light.

One contemplated use of LEPs is the manufacture of polymer light-emitting diode (PLED) displays having pixels with sub-components of red, green, and blue. It is expected that PLED displays will be used in the future for various applications, including televisions, computer monitors, PDAs, other handheld computing devices, cellular phones, and the like. It is also expected that PLED technology will be used for manufacturing light-emitting panels that can be used to provide ambient lighting for office, storage, and living spaces.

During the manufacture of PLED displays, LCD devices, PCBs, as well as other devices, the cure rate of the fluid material can also be important because the cure rate can affect the ultimate physical shape of the microstructures that are formed on the substrate. The cure rate of fluid materials is also particularly important when fluid materials having different colors or other identifiably unique characteristics are deposited adjacently on a single substrate to ensure that the different materials do not mix. For instance, when manufacturing colored PLED displays, it is important that the red, green and blue subcomponents do not mix within the various pixel formations.

To prevent different materials from mixing, thereby preserving their identifiably unique characteristics, it is important to ensure that when a fluid materials is deposited on the substrate that it is sufficiently cured before any other fluid material is deposited adjacently. One method for ensuring the deposited fluid material is sufficiently cured is to allow a sufficient amount of time to pass. This, however, can unnecessarily delay the manufacturing process, thereby increasing the associated manufacturing costs. Another method is to heat the fluid material with radiant heat once the fluid material is deposited on the substrate. Heat can significantly increase the cure rate of the fluid material. However, it can be difficult to position a heater directly above the fluid material during the deposition processes, which may be required to uniformly heat the fluid material. Uniform heating of the fluid material can be important for ensuring a proper formation of the fluid material once it is cured on the substrate. Furthermore, even when a heater can be positioned directly above the fluid material, the heater may be undesirable. In particular, if the fluid material is heated too quickly from radiant heat then an initial layer may form around the fluid material that is likely to implode or collapse during the curing process, thereby perverting the ultimate shape of the microstructure. This is particularly true when the fluid material contains significant percentages of a solvent or another solution that is evaporated from the fluid material during the curing process.

Accordingly, there currently exists a need in the art for improved methods and devices controlling the cure rate of the fluid material deposited on the substrates, particularly when using LEDs and forming display devices.

BRIEF SUMMARY OF THE INVENTION

Briefly summarized, presently preferred embodiments of the present invention are directed to temperature controllable vacuum chucks.

According to one embodiment, the vacuum chucks of the invention generally include a mounting bracket, a porous plate, means for creating a negative air pressure within the cavity and means for controlling the temperature of the porous plate. The mounting bracket has a base, sidewalls circumferentially extending around the base, an open top, and a cavity. The porous plate is mounted within the cavity and is sealably connected by an O-ring with the open top of the mounting bracket. A retaining ridge located at the top of the mounting bracket retains the porous plate within the cavity.

The porous plate is configured to securely mount a substrate against the top surface of the porous plate when negative air pressure exists within the cavity. According to one embodiment, means for creating a negative air pressure within the cavity comprises a vacuum configured to suction air out from the cavity through a hole extending through a sidewall of the mounting bracket. It will be appreciated that pumps and other devices can also be used, inside or outside of the vacuum chuck to create a negative air pressure within the cavity. When a negative air pressure is created within the cavity, air is suctioned through the porous plate, thereby creating a suction force that is capable of securing a substrate on the porous plate.

Once the substrate is secured, manufacturing processes can be performed on the substrate. According to one embodiment, fluid material is deposited on the substrate during a piezoelectric microdeposition (PMD) process, as described below. In order to control the cure rate and ultimate formation of the microstructures formed on the substrate, it can be important to control the cure rate of the deposited fluid material.

According to one embodiment, the temperature controllable vacuum chucks of the invention enable control over the cure rate of the deposited fluid materials by heating the porous plate. During use, the porous plate heats the substrate through conduction, which in turn heats the fluid material on the substrate, thereby controlling the cure rate of the fluid material.

According to one embodiment, the vacuum chucks of the invention provide means for controlling the temperature of the porous plate, may comprise various combination of heaters, temperature sensors, and temperature control systems. According to one embodiment, means for controlling the temperature of the porous plate comprises a heating source that is mounted within the cavity of the vacuum chuck and that is configured to heat the porous plate. Means for controlling the temperature may also include temperature sensors configured to measure the temperature of the porous plate, as well as, temperature control systems connected with the heating source and temperature sensors. The temperature control systems generally enable a high degree of precision in controlling the temperature of the porous plate and the cure rate of the fluid material that is heated through the conduction of heat from the porous plate. A user can monitor and adjust the temperature of the porous plate with the temperature control systems/modules from a computer device.

According to one embodiment, a heating source comprising a Kapton® foil heater is compressed against the bottom of the porous plate, thereby ensuring the heating source uniformly heats the porous plate. A pressure plate mounted on a sliding block assembly forcibly compresses the Kapton® foil heater against the bottom of the porous plate. The sliding block assembly also forcibly raises the porous plate against the retaining ledges of the mounting bracket, thereby creating a seal between the mounting bracket and the porous plate.

One benefit of the vacuum chucks of the invention is the ability to secure a substrate in a desired placement while simultaneously heating the substrate in a uniform manner for controlling the cure rate of fluid materials deposited on the substrate and without overexposing the fluid materials to radiant heat that can undesirably deform the resultant form of the fluid materials once cured. These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Figure 1:
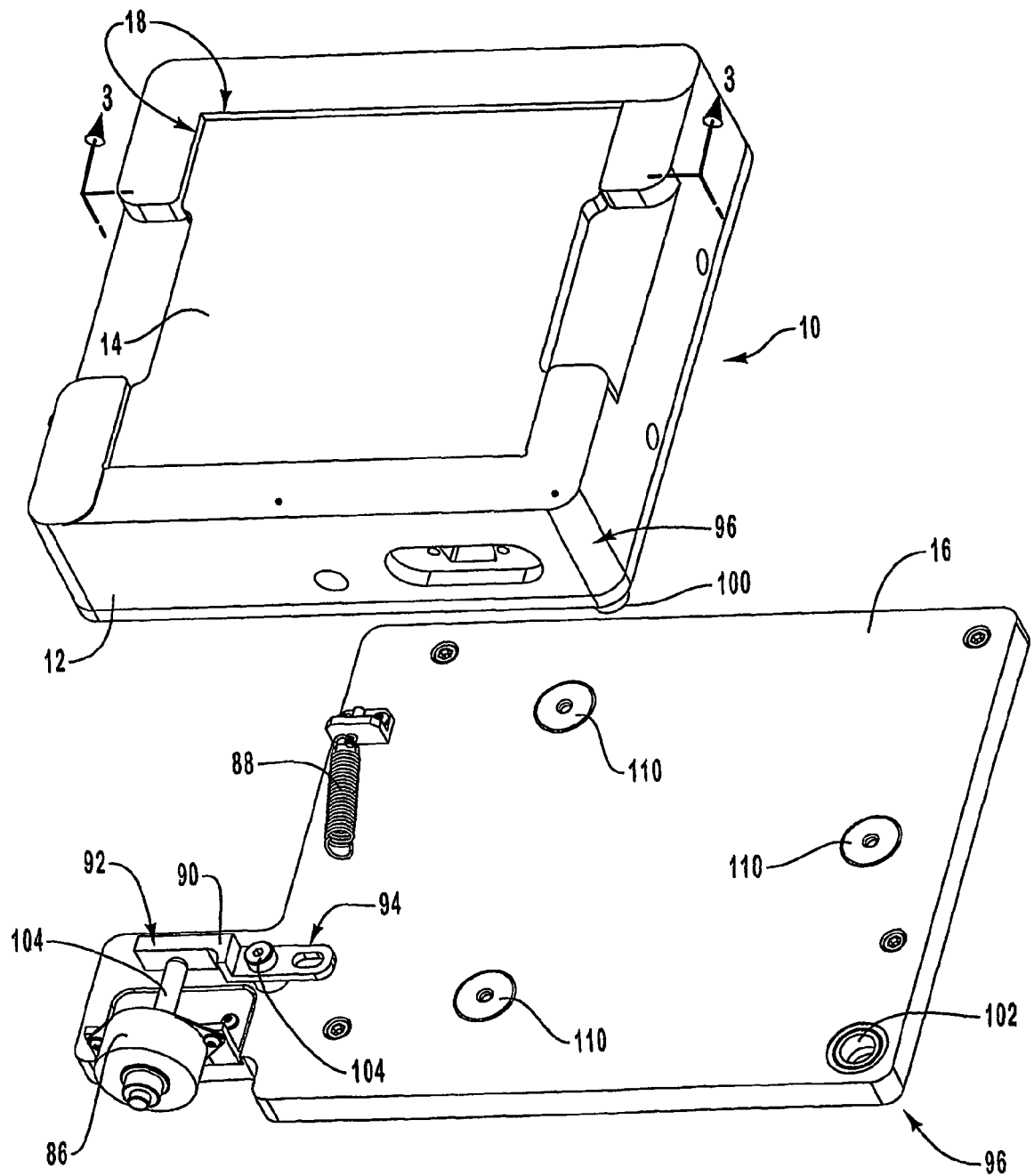
FIG. 1 illustrates a perspective view of one embodiment of the temperature controllable vacuum chuck of the invention and an adjustment plate.

The present invention is generally directed to temperature controllable vacuum chucks and, more specifically, to vacuum chucks configured to secure a substrate in a desired placement while simultaneously heating the substrate in a manner that is sufficient for providing control over the cure rate of fluid materials deposited on the substrate.

The terms "fluid manufacturing material" and "fluid material," as defined herein, should be broadly construed to include any material that can assume a low viscosity form and which is suitable for being deposited onto a substrate for forming a microstructure. Fluid materials may include, but are not limited to, light-emitting polymers (LEPs), which can be used to form polymer light-emitting diode display devices (PLEDs, and PolyLEDs). Fluid materials may also include plastics, metals, waxes, solders, solder pastes, biomedical products, acids, photoresists, solvents, adhesives, epoxies, and the like.

The term "deposit" is generally used herein, in the context of placing fluid material on a substrate.

The term "cure rate," as applied to fluid materials, is generally defined as the rate in which the fluid material dries, solidifies, or is otherwise cured into a solid state on the substrate on which the fluid material is deposited.

The term "substrate," as defined herein, is broadly construed to include any material having a surface that is suitable for receiving a fluid material during a PMD process. Substrates include, but are not limited to, glass plates, pipettes, silicon wafers, ceramic tiles, rigid and flexible plastic and metal sheets and rolls. In certain embodiments, deposited fluid materials may also comprise substrates. For instance, by way of example and not limitation, a cured fluid material may comprise a suitable surface for receiving a fluid material during a PMD process, such as when forming three-dimensional microstructures.

The term "microstructures," as defined herein, generally refers to structures formed with a high degree of precision, and that are sized to fit on a substrate. Inasmuch as the sizes of different substrates may vary, the term "microstructures" should not be construed to be limited to any particular size and can be used interchangeably with the term "structure". Microstructures may include a single droplet of a fluid material, any combination of droplets, or any structure formed by depositing the droplet(s) on a substrate, such as a two-dimensional layer, a three-dimensional architecture, and any other desired structure.

As generally described herein, the temperature controllable vacuum chucks of the invention are configured to secure substrates into desired placements and to control the temperatures of the substrates according to user-defined computer-executable instructions. The term "computer-executable instructions," which is also referred to herein as "program modules" or "modules," generally includes routines, programs, objects, components, data structures, or the like that implement particular abstract data types or perform particular tasks such as, but not limited to, controlling the vacuum force of the vacuum chucks, measuring temperatures at the vacuum chucks, and increasing heat generated by the heating sources within the vacuum chucks. Program modules may be stored on any computer-readable media, including, but not limited to RAM, ROM, EEPROM, CD-ROM or other optical disk storage, magnetic disk storage or other magnetic storage devices, or any other medium capable of storing instructions or data structures and capable of being accessed by a general purpose or special purpose computer.

FIG. 1 illustrates a top right perspective view of one presently preferred embodiment of the vacuum chuck 10 of the invention. As shown, the vacuum chuck 10 comprises a mounting bracket 12 and a porous plate 14. According to one embodiment, the mounting bracket 12 is configured to be mounted on an alignment plate 16, which is discussed in more detail below, and the porous plate 14 is configured to receive and securely mount a substrate.

During use, a substrate is generally aligned on the porous plate 14 with the alignment ledges 18 that are located on the top of the mounting bracket 12. Alignment of the substrate is important, as described below, for enabling the precision that is required for manufacturing certain structures.

The substrate is securely held in a desired alignment on the porous plate 14 by a suction force that is created when air is suctioned into the vacuum chuck 10 through the porous plate 14. Air is able to pass through the porous plate 14 because of small perforations existing in the porous plate 14. The perforations or holes may be formed into the porous plate 14 at any time during or subsequent the manufacture of the porous plate 14. According to one embodiment, small holes are drilled in the porous plate, the size of which may vary to accommodate different needs and preferences.

According to another embodiment, the porous plate 14 is manufactured from a micro-porous air permeable material having holes inherently formed throughout the material. Non-limiting examples of micro-porous air permeable materials include Metapor® and Espor®. According to one embodiment, for instance, the porous plate 14 comprises an aluminum Metapor® plate.

During use, the porous plate 14 can also be used to transfer heat from a heat source contained within the vacuum chuck 10 to a substrate that is mounted on the porous plate 14. Accordingly, it is preferable that the porous plate is composed of a thermally conductive material, such as aluminum, this is configured for efficient heat transfer. It will be appreciated, however, that the porous plate can be manufactured out of any variety of materials, including various metals, plastics, and ceramics.

Figure 2:
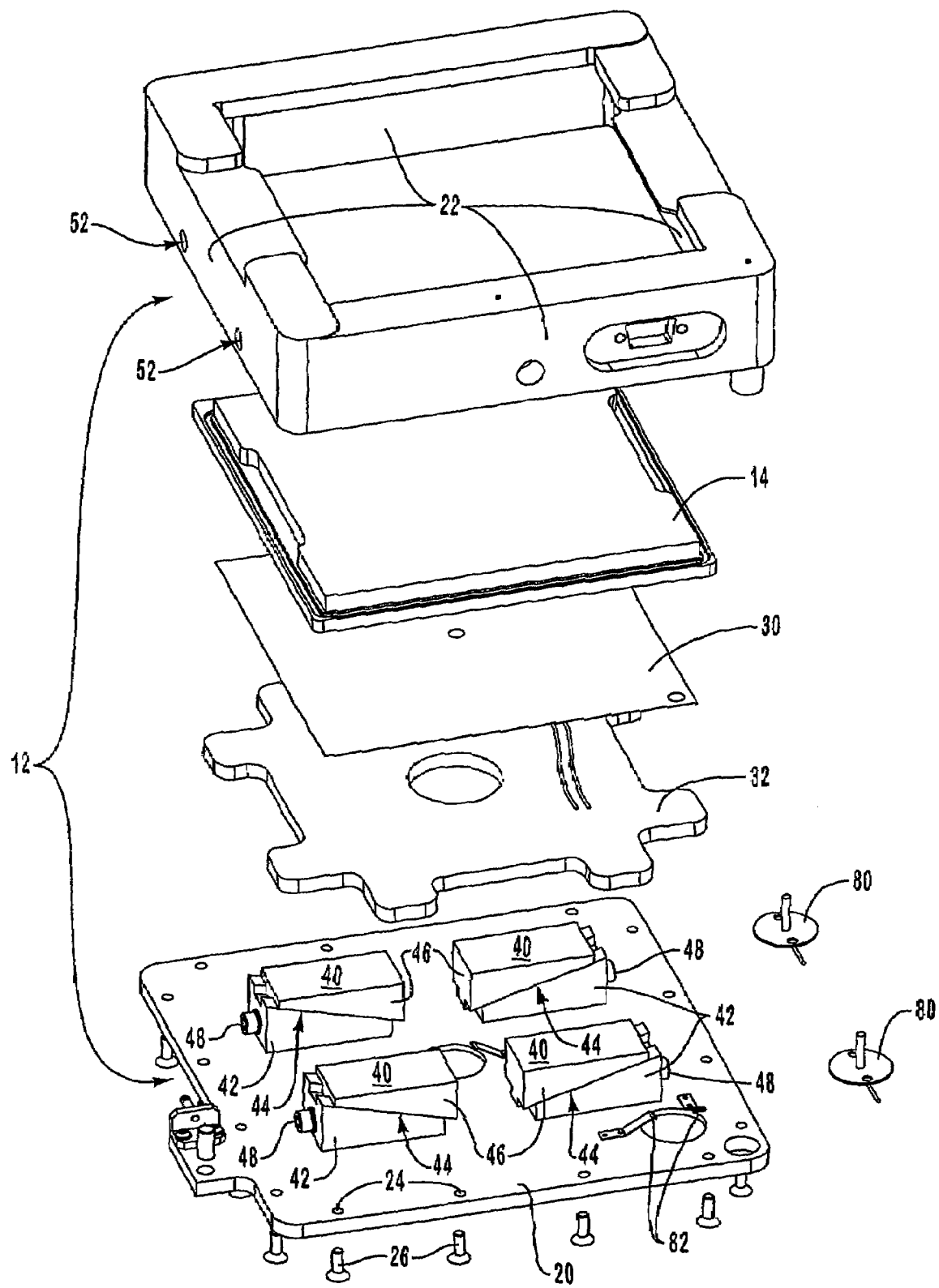
FIG. 2 illustrates an exploded perspective view of the temperature controllable vacuum chuck of FIG. 1 and illustrates the various components of the vacuum chuck including a mounting bracket, a porous plate, a heating source, a pressure plate, a base, sliding block assemblies and temperature sensors.

Attention is now directed to FIG. 2, which illustrates an exploded top left perspective view of the vacuum chuck 10 shown in FIG. 1. As shown, the mounting bracket 12 of the vacuum chuck 10 includes a base 20 and sidewalls 22. The sidewalls 22 are configured to circumferentially extend around the base 20 when connected with the base 20. The sidewalls 22 can be connected with the base 20 with any suitable means, such as with adhesives, welding processes, and with fastening devices like screws and bolts. According to one embodiment, the base 20 include holes 24 through which bolts 26 are passed to secure the sidewalls with the base. A gasket or another sealing device, not shown, may also be used to create an airtight seal between the sidewalls 22 and the base 20 when the mounting bracket 12 is assembled. An airtight seal between the sidewalls 22 and the base 20 can also be created, according to one embodiment, without the use of a gasket.

As generally mentioned above, one function of the porous plate 14 is to transfer heat from a heat source 30 contained within the vacuum chuck 10 to a substrate mounted on the porous plate. To enable uniform heating of the substrate, the heat source 30 is preferably configured to transfer heat to the porous plate 14 in a uniform manner. To this end, according to one embodiment, the heat source 30 comprises a flexible heating element that is configured to be compressed against a large surface area of the porous plate 14 without breaking.

According to one embodiment, the heat source 30 is compressed against the bottom of the porous plate 14 by a pressure plate 32 that is elevated by sliding block assemblies 40 mounted to the base 20 of the mounting bracket 12. The sliding block assemblies 40 generally include a first block 42 with an angled surface 44 with a second block 46 that is slidably biased against the angled surface 44 of the first block 42. A screw 48 passing through the first block 42 is threadably connected with the second block 46 and is configured to raise and lower the second block 46 when rotated.

Figure 3:
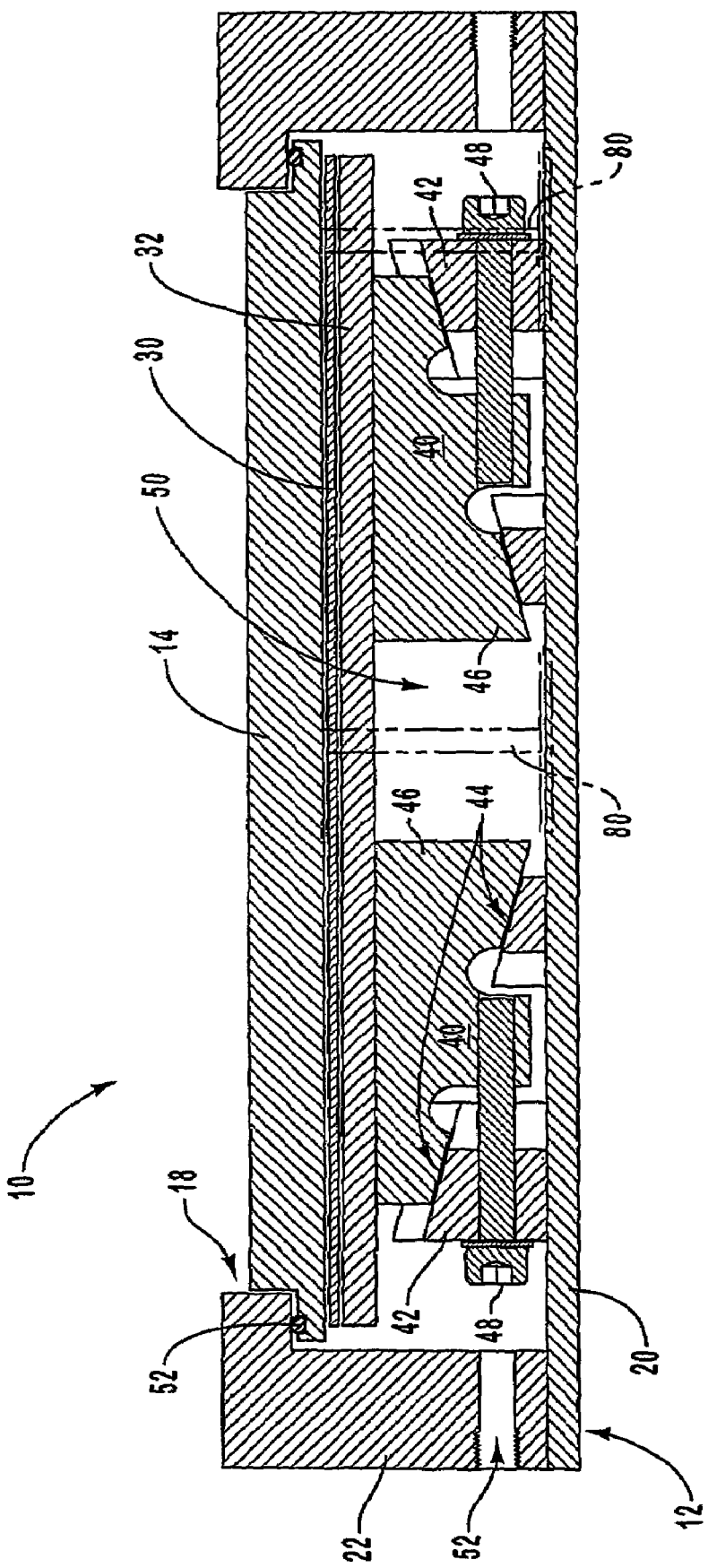
FIG. 3 illustrates a cross-sectional side view of the temperature controllable vacuum chuck of FIG. 1 taken along cross-sectional line 3—3.

FIG. 3 illustrates a cross-sectional side view of the vacuum chuck 10 of FIG. 1 taken along line 3—3 of FIG. 1. As shown, the second block 46 of the sliding block assembly 40 is disposed between the first block 42 and the pressure plate 32. As the screw 48 in the first block 42 is rotated in a first direction, the second block 46 is pulled towards the first block 42 and forced to slide up the angled surface 44 of the first block 42, thereby elevating the pressure plate 32 and compressing the heat source 30 against the porous plate 14. When the screw 48 is rotated in the opposite direction then the second block 46 slides down the angled surface 44 of the first block 42 under the weight of the pressure plate 32 and porous plate 14.

It will be appreciated that when the porous plate 14 is elevated within the cavity 50 of the mounting bracket 12 that the it causes an O-ring 52 disposed between the porous plate 14 and the mounting bracket 12 to be compressed, thereby creating an airtight seal between the porous plate 14 and a retaining ridge 18 of the mounting bracket 12. The airtight seal may be provided by an O-ring 49 existing between the porous plate 14 and the mounting bracket 12. The retaining bridge 18 keeps the porous plate 14 from being pushed out of the cavity 50 and, therefore, comprises one suitable means for retaining the porous plate 14 within the cavity of the mounting bracket 50.

According to one embodiment, the vacuum chuck 10 includes a plurality of sliding block assemblies 40 mounted at different locations on the base 20 of the mounting bracket 12. This is useful for enabling control over the planar orientation of the porous plate 14 and any substrates mounted on the porous plate 14. For instance, according to the embodiment shown in FIG. 2, the vacuum chuck 10 includes four sliding block assemblies 40 that are each mounted to the base 20 of the vacuum chuck 10 in different quadrants. Each of the slide block assemblies 40 can be individually adjusted to control the elevation of the porous plate 14 in the corresponding quadrants where they are located, thereby enabling the porous plate 14 to be precisely positioned into a desired planar alignment. The planar alignment of the porous plate 14 is important because it can directly affect the planar alignment of the substrates that are mounted on the porous plate, thereby affecting the precision of certain manufacturing processes performed on the substrate, as generally described herein.

Once the vacuum chuck 10 is assembled, the slide block assemblies 40 can be adjusted with a small tool, such as a screw driver or an allen wrench, that is inserted though access ports 52 formed in the sidewalls of the mounting bracket. When the slide block assemblies 40 are not being adjusted the access ports can be sealed closed with a screw or a plug.

Although the previous discussion goes into some detail regarding the specific arrangements and configurations of the slide block assemblies 40, it will be appreciated that the quantities and locations of the slide block assemblies 40 may vary to accommodate different needs and preferences. It will also be appreciated that, according to the invention, the slide block assemblies 40 comprise only one of various suitable means that can be incorporated for adjusting the porous plate 14 within the cavity 50 of the mounting bracket 12. Other non-limiting examples of means for adjusting the porous plate 14 within the cavity 50 of the mounting bracket 12 include computer numerically controlled slide assemblies, motorized stepper motors, solenoid devices, and hydraulic and pneumatic devices.

Figure 4:
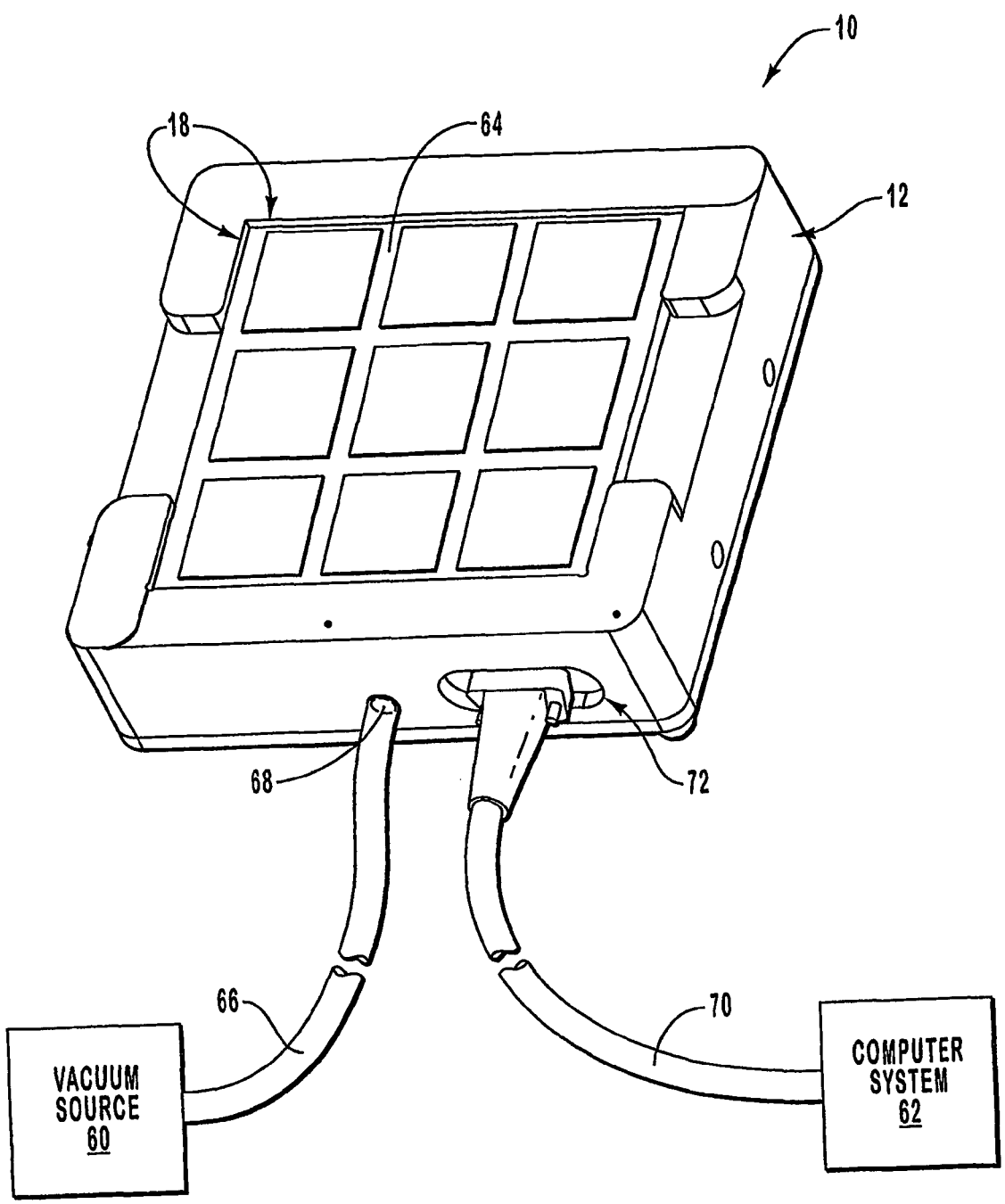
FIG. 4 illustrates one embodiment of the temperature controllable vacuum chuck of the invention connected with a vacuum source and a computer system and in which a substrate is mounted on the porous plate.

FIG. 4 illustrates one embodiment of the vacuum chuck 10 of the invention in which the vacuum chuck 10 is assembled and connected with vacuum source 60 and a computer system 62. As shown, a substrate 64 is mounted on the porous plate 14 and aligned against the alignment ledges 18. As generally described above, the substrate 64 is held in place on the porous plate 14 by a vacuum force that is created by suctioning air through the porous plate 14. Air is suctioned through the porous plate 14, according to one embodiment, when a negative air pressure is created within the cavity of the vacuum chuck 10. The cavity 50 of the vacuum chuck, which is also referred to herein as the cavity 50 of the mounting bracket, generally comprises the space between the boundaries of the mounting bracket, as shown in FIG. 3. Accordingly, the porous plate 14 is considered to be mounted within at least a portion of the cavity 50.

Negative air pressure is created within the cavity 50 of the vacuum chuck 10 by any suitable means, such as, for example, with a vacuum or a pump that is contained either inside or outside of the cavity 50 of the mounting bracket 12. According to the embodiment shown in FIG. 4, means for creating negative air pressure within the cavity 50 of the vacuum chuck 10 comprises a vacuum source 60 that is located outside of the vacuum chuck 10 and that Is connected with the vacuum chuck 10 by a hose 66. The vacuum source 60 suctions air out from the cavity of the mounting bracket through a hole 68 that is located in the sidewall of the mounting bracket 12. According to one embodiment, the vacuum source 60 is operated and controlled by computer modules of the computer system 62.

Computer modules of the computer system 62 can also be used to control the temperature of the heat source of the vacuum chuck 10. Cables 70 linking the heat source and any other electronically controllable devices located within the vacuum chuck 10 to the computer system 62 are connected at a coupling 72 formed within the sidewalls of the mounting bracket 12. The coupling 72 is preferably formed in an airtight manner so as to help maintain a desired level of negative air pressure within the cavity of the mounting bracket 12. According to one embodiment, the coupling 72 is configured to connect to a standard DB9 cable. It will be appreciated, however, that the coupling 72 may also be configured to connect with other types of cables and devices.

Returning now to FIGS. 2 and 3 it is shown how, according to one embodiment, the vacuum chucks 10 of the invention include temperature sensors 80. The temperature sensors 80 are configured to measure the temperature of the porous plate 14. According to one embodiment, the temperature sensors 80 comprise resistance temperature detectors (RTDs). The temperature sensors 80 may, however, also comprise other means for detecting the temperature of the porous plate 14. For instance, by way of example and not limitation, the temperature sensors 80 may comprise thermocouples.

According to one embodiment, the temperature sensors 80 are placed into direct contact or extremely close proximity with the porous plate 14 within the vacuum chuck 10. As shown in FIG. 2, the vacuum chuck 10 may include springs 82 that are mounted to the base 20 of the mounting bracket 12 and that are configured to bias the temperature sensors 80 against the porous plate 12. The temperature sensors 80 are also preferably linked to computer modules of the computer system 62 of FIG. 4 for enabling a user to monitor the temperature of the porous plate with a high degree of precision.

According to one embodiment, the temperature sensors 80 and corresponding modules enable a user to accurately determine the temperature of the porous plate 14 within about 0.5° Fahrenheit. To ensure the temperature of the porous plate 14 is substantially uniform, a plurality of different temperature sensors 80 can be used to measure temperatures at various locations on the porous plate 14. According to one embodiment, for example, one temperature sensor 80 measures the temperature of the porous plate 14 at a central region of the porous plate 14 and another temperature sensor 80 measures the temperature of the porous plate at a corner region of the porous plate.

It will be appreciated that the temperature sensors 80, in combination with the heat source 30 and the corresponding computer modules comprise one suitable means for controlling the temperature of the porous plate 14. The heat source 30 alone, or in combination with the corresponding computer modules of the computer system 62 may also comprise suitable means for controlling the temperature of the porous plate 14. Control over the temperature of the porous plate 14 is useful because it generally enables control over the temperature of the substrate 64 mounted on the porous plate via thermal conduction.

By controlling the temperature of the substrate 64, as described above, it is also possible to control the cure rate of the fluid materials deposited on the substrate. It will be appreciated that this is particularly useful for enabling control over the ultimate formation of the fluid material once cured, as generally described above. For instance, control over the cure rate of different fluid materials can help prevent the mixing of the different fluid materials before they cure, thereby preserving the identifiably unique characteristics of the different fluid materials. Controlling the cure rate can also help prevent deformations of the fluid material that may otherwise occur when the fluid material cures too slowly or too quickly. Accordingly, the temperature control modules are preferably configured to enable an operator to monitor the temperature of the porous plate and to adjust the heat source within the vacuum chuck to accommodate for the different cure rates and properties of the different fluid materials that are deposited on the substrate 64.

The computer modules are also preferably configured to calculate and measure the thermal expansion of the porous plate 14 and substrate 64 so that a desired alignment between the substrate 64 and any tools used to deposit the fluid material on the substrate can be maintained.

For instance, according to one preferred embodiment, the vacuum chucks 10 of the invention are incorporated within PMD systems configured to deposit fluid materials onto substrates with a high degree of precision. In order to obtain the precision that is required for the PMD processes it is necessary to ensure that the substrate 64 maintains a precise alignment with the PMD tools used to deposit the fluid material onto the substrate. However, if the coefficient of thermal expansion and the temperature to which the substrate is heated is too high, the substrate can expand to the point at which a calibration and alignment process performed on the unheated substrate may not be accurate. In such circumstances, it is important to correct any misalignment of the substrate.

One of at least two mechanisms can be used to compensate for thermal expansion. First, if the coefficient of thermal expansion is known, the new position of the entire substrate can be identified based on the original position and the expected expansion or contraction. Second, the alignment systems, described below, can be used to recalibrate and align the substrate after heating. Although either technique can be suitable, the latter is often more accurate, since direct measurement of the position of the substrate is used.

Figure 5:
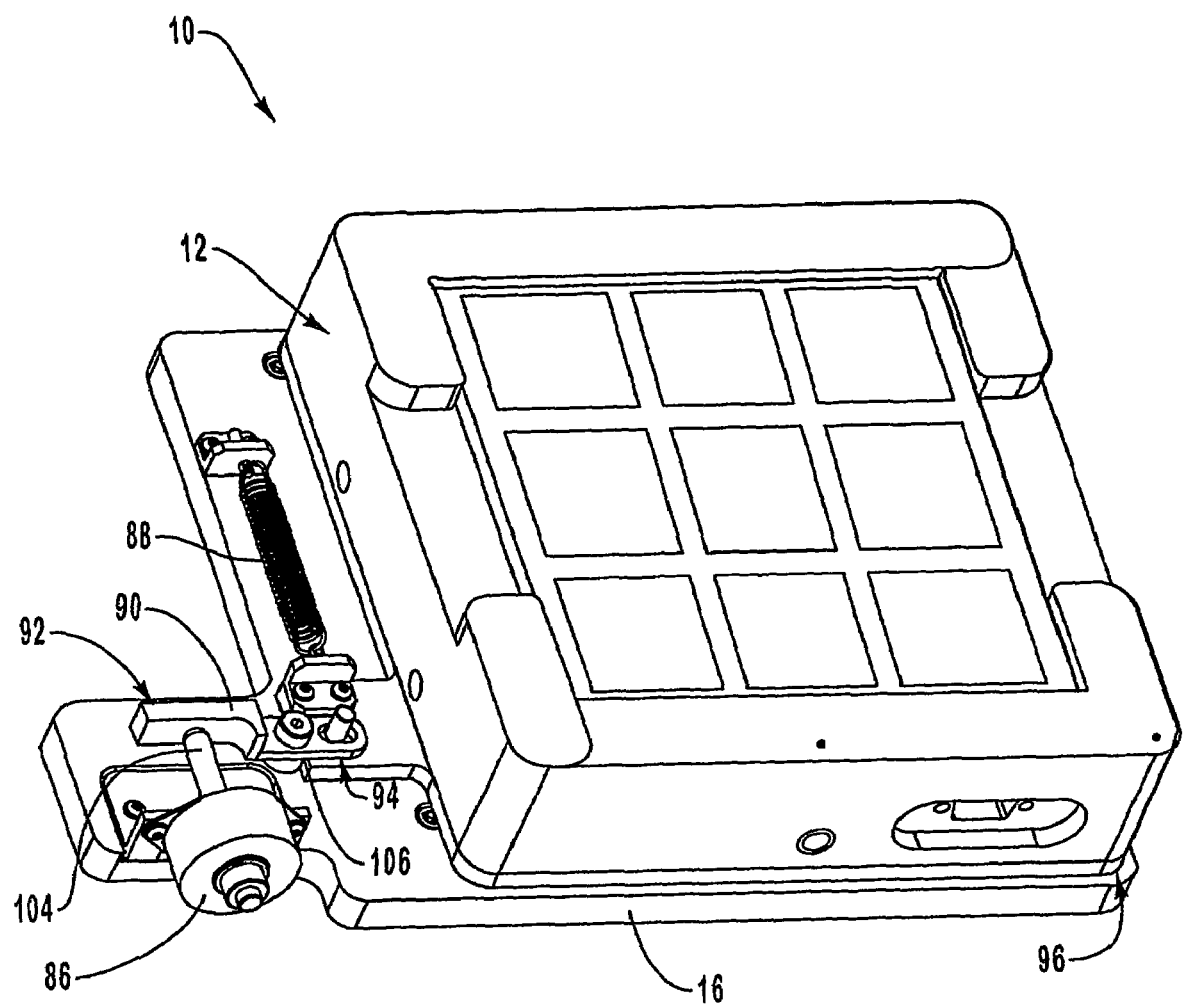
FIG. 5 illustrates a perspective view of one embodiment of the temperature controllable vacuum chuck of the invention that is mounted on the adjustment plate shown in FIG. 1.

One means for providing the desired alignment of the substrate is with the alignment plate 16 shown in FIGS. 1 and 5. For instance, if the angular alignment 16 of the substrate or the vacuum chuck 10 is not proper then the vacuum chuck 10 can be pivoted with the alignment plate 16 until the desired alignment is obtained.

As shown, the pivot plate 16 includes a stepper motor 86, a spring 88, and a pivot arm 90. The pivot arm 90 is connected with the stepper motor 86 at a first end 92 and is connected with the spring 88 and the vacuum chuck 10 at a second end 94. According to one embodiment, the mounting bracket 12 is pivotally connected with the alignment plate 16 at a pivot corner 96. In particular, according to one embodiment, the mounting bracket 12 comprises a pivot post 100 that is configured to pivot within a bearing or a hole 102 in the pivot corner of the alignment plate 16, thereby enabling the mounting bracket 12 to pivot on the alignment plate 16.

The mounting bracket 12 is controllably pivoted at the pivot corner 96, according to one embodiment, through the operation of the stepper motor 86. In particular, the extension arm 104 of the stepper motor 86 can be extended to apply a force to the first end 92 of the pivot arm 90, which in turn causes the pivot arm 90 to pivot in a clockwise rotation about pivot point 106. Because the second end 94 of the pivot arm 90 is connected with the mounting bracket 12, the mounting bracket 12 is forced to pivot about the pivot corner 96 in a counterclockwise rotation.

The mounting bracket 12 can also pivot in the opposite direction. For instance, when the arm extension 104 of the stepper motor 86 is retracted, the spring 88 contracts and forces the second end 94 of the pivot arm 90 to move towards the spring 88, thereby causing the mounting bracket 12 to pivot about the pivot corner 96 in a clockwise rotation. While pivoting, according to one embodiment, the mounting bracket 12 glides over low friction spacers 110 that are shown in FIG. 1. These low friction spacers 110 are mounted on the alignment plate 16 and that are configured to enable the mounting bracket 12 to pivot unobstructedly. The low friction spacers 110 preferably comprise a low friction material such as, but not limited to, teflon and nylon.

The vacuum chucks of the invention, as described, can be used for a variety of processes and with a variety of devices. One suitable application for the vacuum chucks of the invention includes securing a substrate and controlling the temperature of the substrate during a PMD process. Accordingly, a description of a PMD system capable of performing a PMD process will now be provided for context.

According to the invention, an Ink jet head can deposit fluid PMD processes of the invention, as best described in contemporaneously filed PCT Patent Application No. PCT/US2002/017519, filed May 31, 2002, entitled Microdeposition Apparatus; PCT Patent Application No. PCT/US2002/017523, filed May 31, 2002, entitled Industrial Microdeposition System For Polymer Light Emitting Diode Displays, Printed Circuit Boards And The Like; PCT Patent Application No. PCT/US2002/017373, filed May 31, 2002, entitled Interchangeable Microdeposition Head Apparatus And Method; PCT Patent Application No. PCT/US2002/017355, filed May 31, 2002, entitled Waveform Generator For Microdeposition Control System; PCT Patent Application No. PCT/US2002/017521, filed May 31, 2002, entitled Over-Clocking In A MicropositionControl System To Improve Resolution; PCT Patent Application No. PCT/US2002/017370, filed May 31, 2002, entitled Apparatus For Microdeposition Of Multiple Fluid Materials; each of which is incorporated herein by reference. Many structures can be manufactured according to the invention less expensively, more efficiently, and more accurately than the same structures manufactured using PMD processes cannot be manufactured in conventional ways. Moreover, the PMD processes of the invention are compatible with clean room environments and with fluid manufacturing materials that cannot be contaminated during or after the manufacturing processes.

Figure 6:
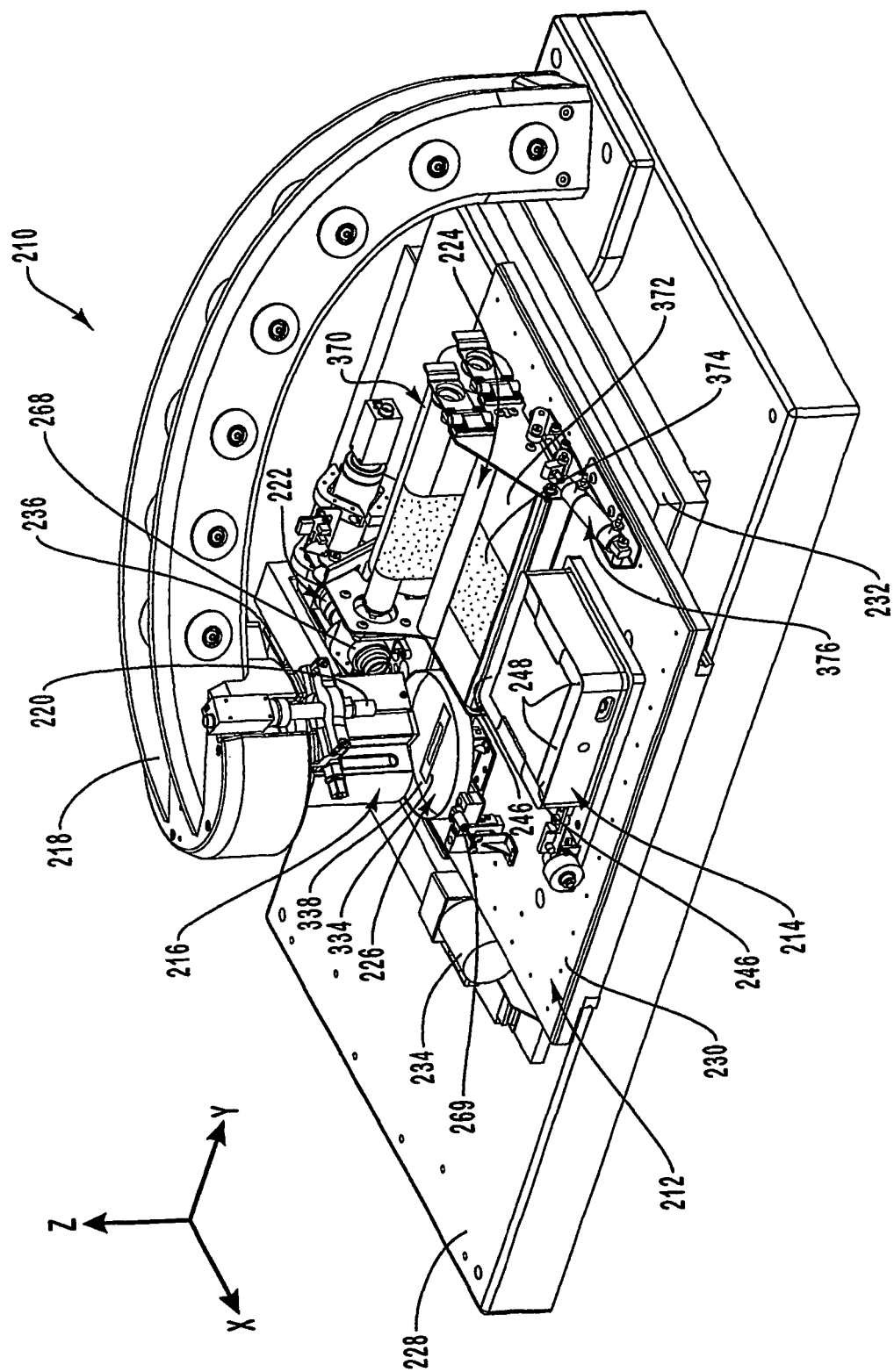
FIG. 6 illustrates a perspective view of one embodiment of a PMD system configured for using the vacuum chuck of the invention that includes a PMD head support, a PMD head, a stage, a vacuum chuck of the invention, a capping station, a maintenance station, an alignment component, and a drop diagnostics assembly.

FIG. 6 illustrates one exemplary PMD system 210 that includes a stage 212, a vacuum chuck 214, a PMD head 16, a PMD head support 18, an alignment component 20, a drop diagnostics assembly 22, a maintenance station 24, and a capping station 26.

As shown, the stage 212 and the PMD head support 218 are mounted to a fixed surface 228. The fixed surface 228 may comprise any surface suitably configured to provide stability to the PMD system 210 and to minimize vibrations capable of compromising the precision of the PMD system 210 during use. According to one embodiment, the fixed surface 228 comprises a granite block. However, it will be appreciated that the fixed surface 228 may also include other materials and structures.

Figure 7:
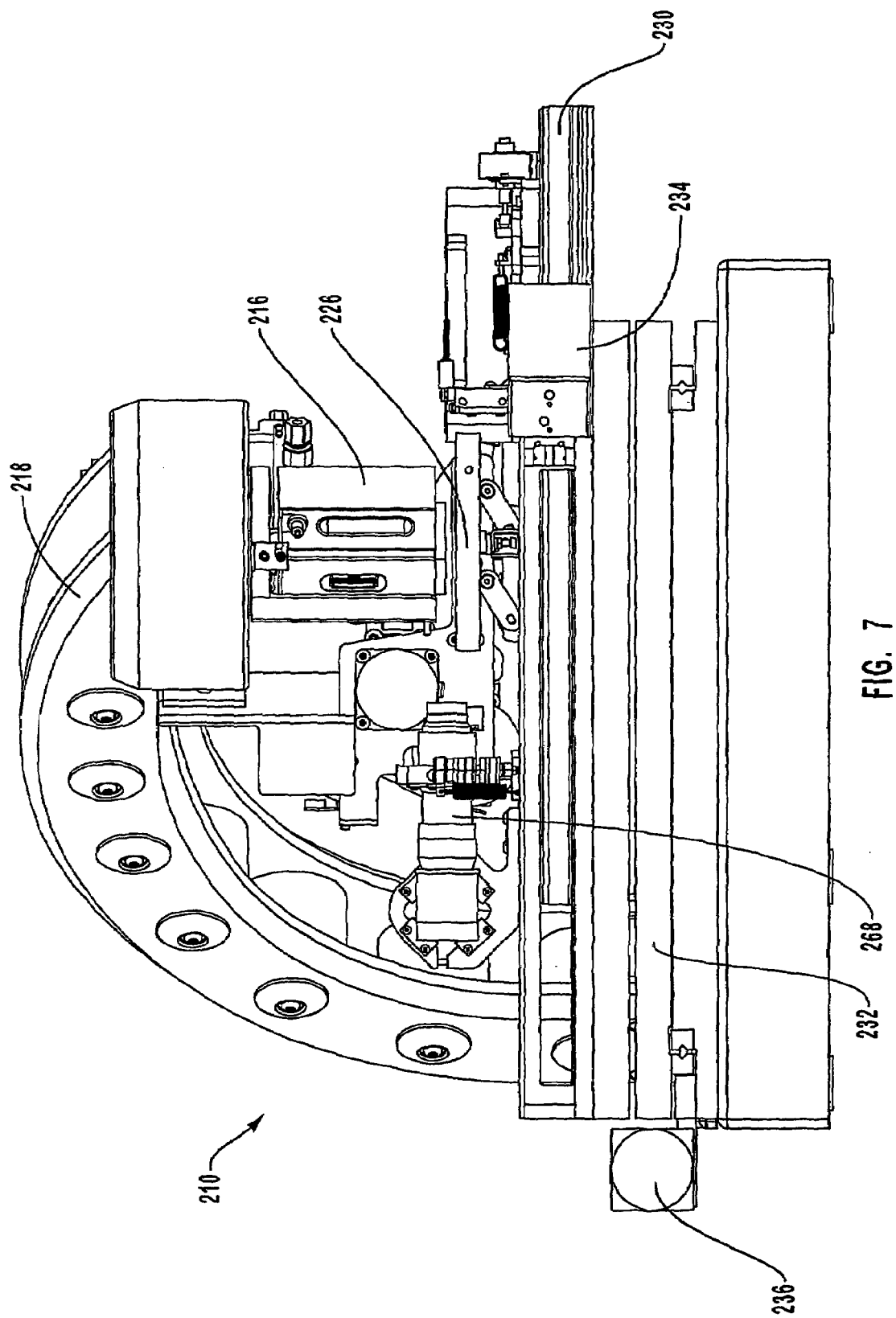
FIG. 7 illustrates a side view of the PMD system of FIG. 6.
Figure 8:
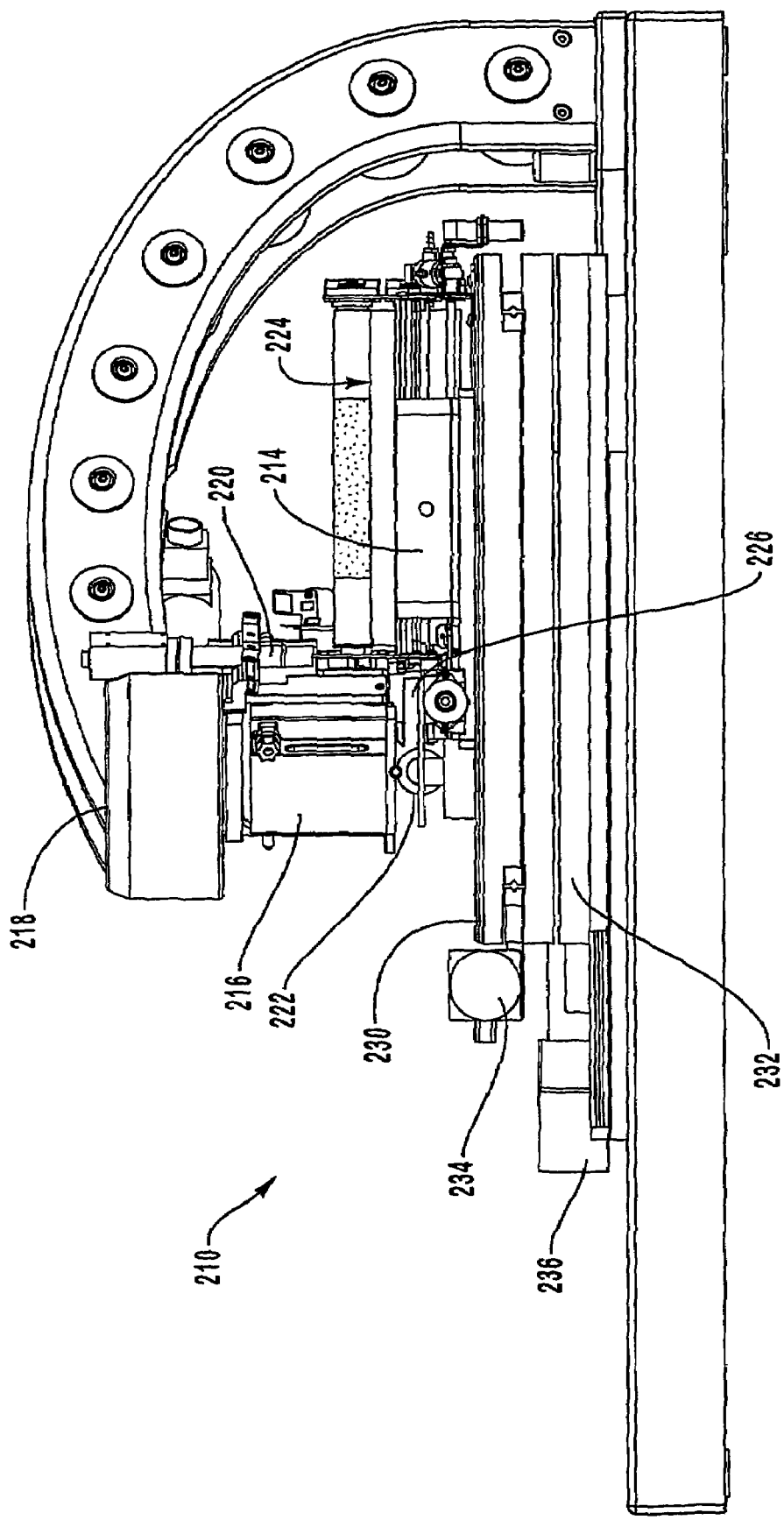
FIG. 8 illustrates a front view of the PMD system of FIG. 6.

FIGS. 7 and 8 illustrate the respective side and front views of the PMD system 210 of FIG. 6. As shown, the stage 212 comprises a top mounting plate 230 and an intermediate plate assembly 232, each of which is configured to move in one of two different directions. In particular, the top mounting plate 230 is connected to a first motor 234 configured to drive the top mounting plate 230 in a first horizontal direction, shown as the X axis in FIG. 6, and the intermediate plate assembly 232 is connected to a second motor 236 configured to drive the intermediate plate assembly 232, as well as the top mounting plate 230, in a second horizontal direction, shown as the Y axis in FIG. 6. The first and second motors 234 and 236 may be operated exclusively or simultaneously to provide any desired movement of the stage 230, relative to the PMD head 216, in the horizontal X-Y plane. Accordingly, it will be appreciated that the stage 212 is also capable of moving simultaneously in both the X and Y directions of the X-Y plane. The mobility of the stage 212 in the X-Y plane is useful for moving a substrate mounted on the stage 212 into alignment with the PMD head 216 and for moving the substrate during the PMD processes of the invention, as generally described below. It will be appreciated that the stage 212, as configured, is configured for clean room environments, where moving parts, particularly moving parts that have solid surfaces moving against each other, generally cannot be used if the parts are positioned above the substrate.

As shown in FIGS. 6–8, various PMD components are mounted on the top mounting plate 230 of the stage 212, and will therefore move with the top plate 230. These components, which include the vacuum chuck 214, the capping station 226, the maintenance station 224, and the drop diagnostics assembly 222 will now be discussed in detail.

Initially, the vacuum chuck 214, which has been described above, provides one suitable means for securing a substrate in a fixed position on the stage 212 in a precise alignment with the PMD head. Initial alignment is provided when the substrate 238 is mounted on the vacuum chuck 214 and aligned with ledge supports 246, as generally described above, because the vacuum chuck 214 is generally aligned with the PMD head 216. To ensure the vacuum chuck 214 is aligned with the PMD head 216, two reference points 248 that are provided on the vacuum chuck 216. The alignment component 220, which is discussed in more detail blow, detects the reference points 248 on the vacuum chuck 214 and determines whether the vacuum chuck 214 is in proper alignment with respect to the PMD head 216. If the vacuum chuck 214 is not in proper alignment then the vacuum chuck 214 is pivoted until the desired alignment is obtained, as described above. After the substrate 238 (shown in FIG. 9) is mounted on the vacuum chuck 214, the alignment component 220 is also used to identify the precise alignment of the substrate 238 with the PMD head 216. If the substrate 238 is not in the proper alignment then the vacuum chuck 214 is again pivoted until the substrate 238 is properly aligned.

Pivoting of the vacuum chuck 214 may be performed by the PMD system 210 at any time to correct any misalignment of the vacuum chuck 214 or the substrate 238 with the PMD head 216. It will also be appreciated that pivoting the vacuum chuck 214 can be performed for creating a desired misalignment of the substrate 238 with the PMD head, which may be required when forming certain microstructures on the substrate 238. According to one embodiment, desired alignment between the substrate 238 and the PMD head 216 can also be obtained by rotating the PMD head 216 with respect to the substrate 238 at the PMD head support 218, such as for example, with a turret, as described hereinbelow.

Figure 9:
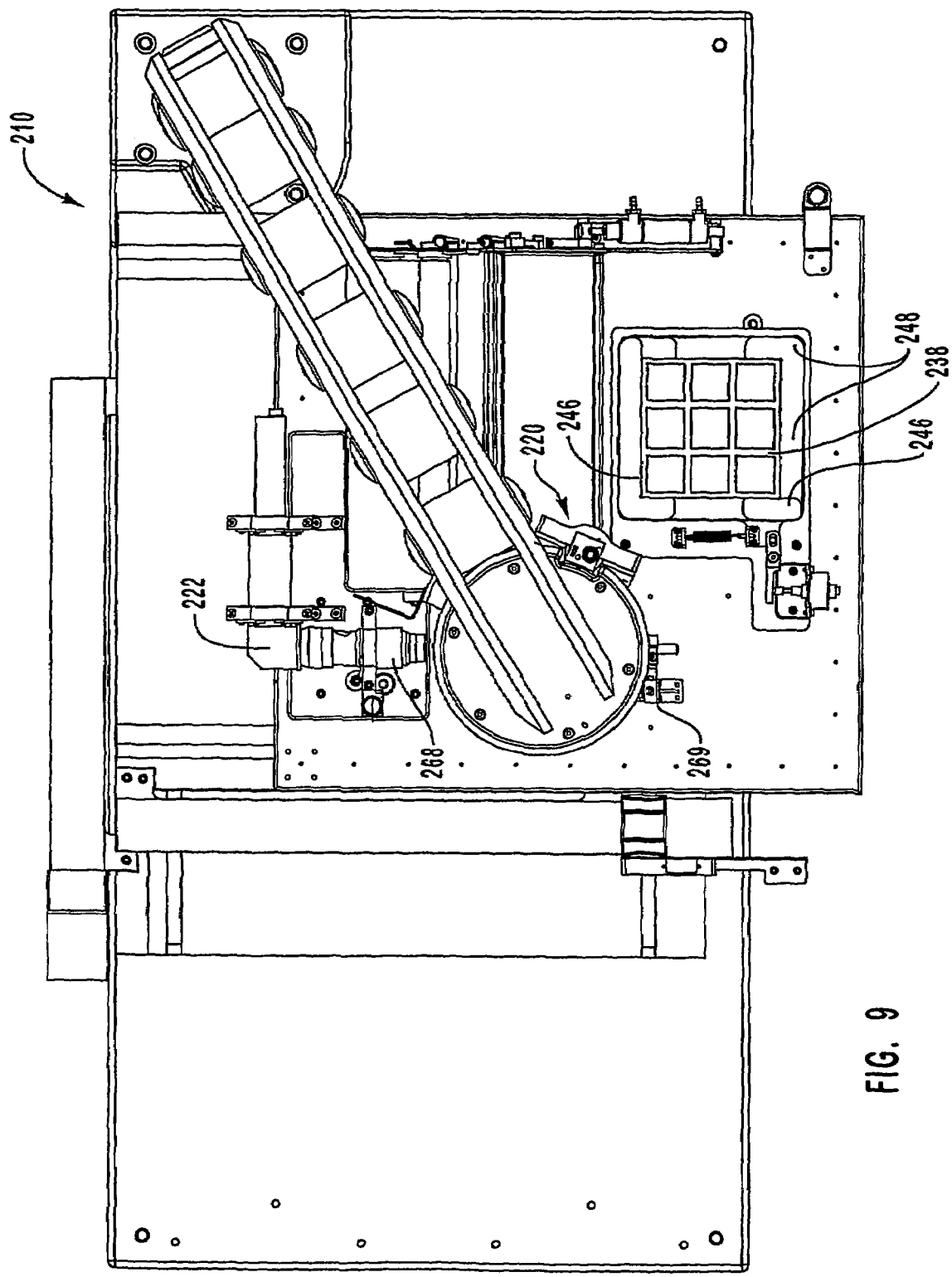
FIG. 9 illustrates a top view of the PMD system of FIG. 6.

Specific reference is now directed to the alignment component 220. As shown in FIGS. 6 and 8–9, the alignment component 220 is fixedly attached to the PMD head support 218. According to one embodiment, the alignment component 220 comprises a camera having any combination of digital and optical capabilities. The camera is linked to optical/digital recognition computer modules of the PMD system 210 configured to identify the reference points 248 on the vacuum chuck 214, as well as precise alignment marks that are etched on the substrate 238. These alignment marks, which are referred to herein as fiducial marks, are typically preformed on the substrate 238 and are generally too small to be seen by the naked eye. In one embodiment, fiducial marks include perpendicular cross-hairs etched on the substrate 238.

Fiducial marks are used as a basis for aligning the substrate 238 with the PMD head 216 because alignment to the edge of the substrate 238 or the vacuum chuck 214 is typically not accurate enough to form microstructures on the substrate 238 with sufficient precision required for certain products. For example, in one embodiment, the PMD system 210 deposits polymer droplets onto pixels of a PLED display within +/–10 microns, which is roughly $\frac{1}{10}^{th}$ the diameter of the human hair. It will be appreciated that the ability to use PMD processes to precisely deposit fluid material with such accuracy is an improvement over the prior art.

When a glass plate or another substrate 238 is mounted on the vacuum chuck 214, the PMD system 210 automatically uses the camera and optical recognition modules associated with the alignment component 220 to identify the fiducial marks or other reference markings on the substrate 238. The vacuum chuck 214 or PMD head 216 is then automatically pivoted or rotated, as required, to correct any misalignment between the PMD head 216 and the substrate 238. In this manner, alignment existing between the PMD head 216 and the substrate 238 is obtained, in a matter of seconds, to tolerances within about 3 microns. Finally, once the desired alignment is obtained, the PMD system 210 is capable of precisely depositing droplets of the fluid material onto predetermined locations of the substrate 238 according to the processes of the invention.

According to one embodiment, microstructures are formed on the substrate 238 as droplets are deposited from the PMD head 216 while the substrate 238 is moved beneath the PMD head 216 the stage 212. For instance, rows of droplets can be formed on the substrate 238 when the stage 212 moves the substrate 238 in the X direction. The stage 212 can also be moved in the Y direction between the deposition of rows, thereby enabling a plurality of rows to be formed. The stage can also be moved in any combination of X and Y directions for enabling a structure to be precisely formed over the entire substrate 238, or any portion thereof.

Although alignment of the substrate 238 with the PMD head 216 and corresponding nozzles is important, It can be thwarted by inconsistencies or irregularities of the nozzles located on the PMD head 216. The PMD head 216 may include any number of nozzles, such as, for example, between one and 256 nozzles. If any number of the nozzles are misfiring or discharging droplets of the fluid material in an undesired direction then the alignment of the substrate 238 with the PMD head 216 can be defeated. Accordingly, it is important to identify the firing characteristics of each nozzle on the PMD head 216. Once the firing characteristics of the individual nozzles are known, it is possible to individually control the nozzles with the computer modules of the invention to achieve the desired discharge of the fluid material from the nozzles.

The drop diagnostics assembly 222, shown in FIGS. 6–9, is provided to measure and identify the firing characteristics of the individual nozzles of the PMD head 216. The drop diagnostics assembly generally includes a camera 268 having any combination of digital and optical capabilities. The camera is linked to optical/digital recognition computer modules of the PMD system 210 configured to identify the different firing characteristics of the individual nozzles. This may be accomplished, for example, by capturing various images of the droplets that are discharged out of the nozzles and by identifying the characteristics of the droplets. If a single nozzle of the PMD head is not firing properly the drop diagnostics assembly and corresponding modules detect the error. The PMD system 210 then tries to automatically repair the nozzle with maintenance procedures, which are described below. If the error cannot be automatically corrected, the PMD system 210 warns the operator and manufacturing is paused, thereby preventing costly losses in device yields. The PMD head 216 can then be repaired by the operator or may be interchanged, if required.

According to one embodiment, the camera 268 of the drop diagnostics assembly 220 is a right angle camera 268 configured to fit on the stage 212. A backlight, such as strobe light 269, is also provided to enhance the quality of the images captured by the camera 268 and for capturing an image of the droplet in flight. The use of a strobe light to photograph moving objects is well known in the art of photography.

To perform drop diagnostics, the PMD head 216 is moved between the camera 268 and the strobe light 269, above the capping station 226. Droplets are then discharged from the nozzles of the PMD head 216 into the capping station 226. The characteristics of the droplets and the firing characteristics of the nozzles are then determined, as described below, upon capturing two orthogonal images of the droplets discharged from the nozzles. It is preferred that the nozzles being tested are centered in the camera's field of view for maximum accuracy and that they are tested individually.

According to one embodiment, a first image is taken of a first droplet when the PMD head is in a first position and the second image is taken of a second droplet fired from the same nozzle after the PMD head has been rotated by 90 degrees. According to another embodiment, the two images are taken simultaneously of a single droplet using two orthogonally mounted cameras. Upon capturing the images of the droplets, the optical recognition modules of the PMD system 210 use the images and firing information to calculate the drop volume, drop velocity, drop nozzle placement, drop angle of deviation, and drop formation, thereby enabling the PMD system 210 to compensate for any deficiencies or variation between the nozzles of the PMD head 216.

Although alignment of the PMD head 216 with the substrate 238 has thus far been described as a step to be performed after mounting the substrate on the PMD system, it will be appreciated that alignment can also be performed whenever the PMD head 216 is interchanged or otherwise mounted on the PMD system 210.

Figure 10:
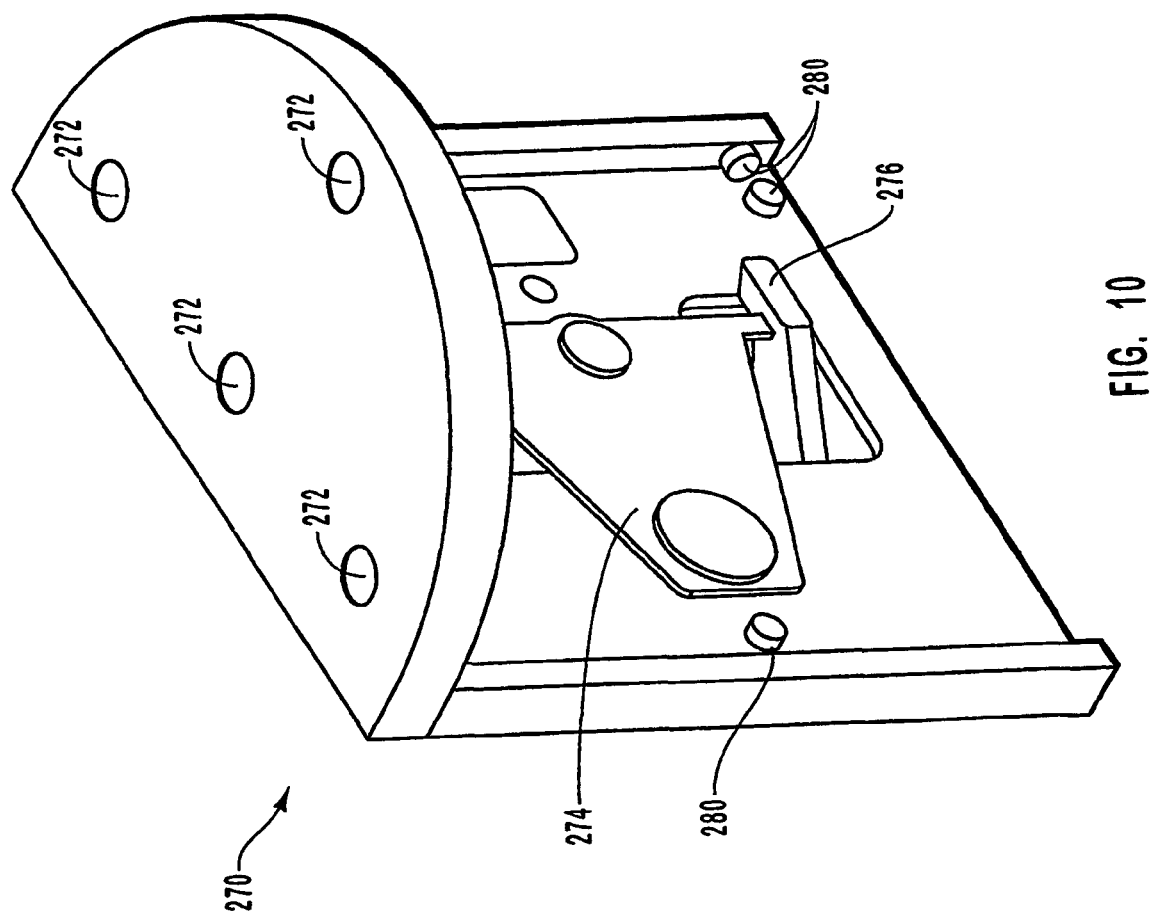
FIG. 10 illustrates a perspective view of a mounting bracket configured for coupling the PMD head of the PMD system to the PMD head support.

Reference will now be directed to FIGS. 10–13 for helping describe how the PMD head 216 is mounted on the PMD system 210. FIG. 10 illustrates a perspective view of a mounting bracket 270 used according to the invention to couple the PMD head with the PMD head support 218 of FIGS. 6–9. As shown, the mounting bracket 270 includes a plurality of holes 272 through which bolts can pass to secure the mounting bracket 270 to the PMD head support.

Figure 11:
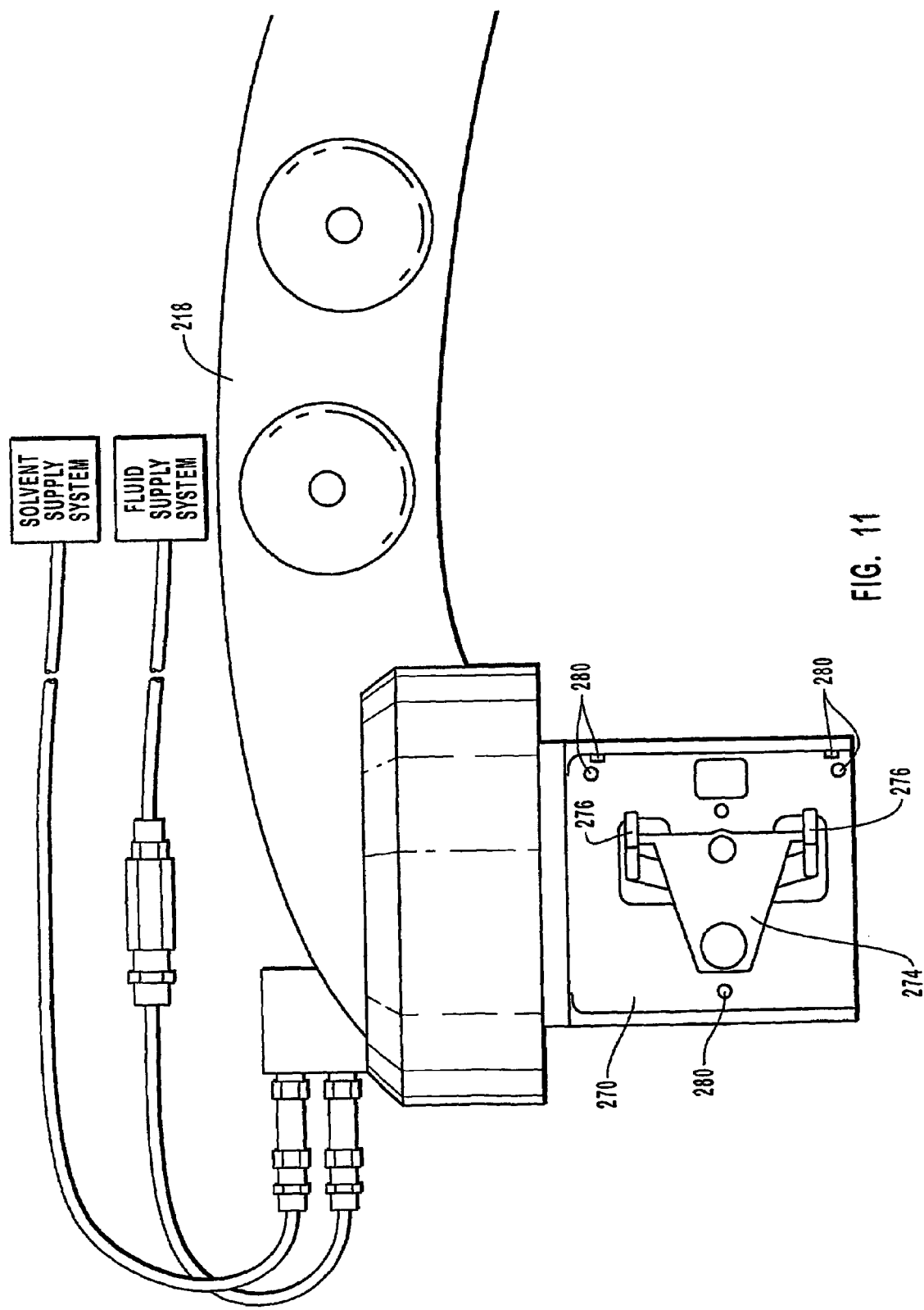
FIG. 11 illustrates a side view of the mounting bracket connected with a PMD head support that includes tubing of the fluid manufacturing supply system and a solvent supply system.

FIG. 11 illustrates how the mounting bracket 270 appears when mounted on the PMD head support 218. As shown in FIGS. 10 and 11, the mounting bracket 270 includes a latching mechanism 274 configured to securely hold the PMD head to the mounting bracket 270 during use. The latching mechanism 274 generally comprises latching arms 276 configured to clasp onto corresponding recesses formed in the PMD head. The latching arms 276 are operated by a lever 278, shown in FIG. 14, that is located on the opposite side of the mounting bracket 270. The mounting bracket 270 also includes datum points 280 that are used to ensure the PMD head is properly aligned against the mounting bracket 270 when the latching arms 276 pull the PMD head against the mounting bracket 270.

Figure 12:
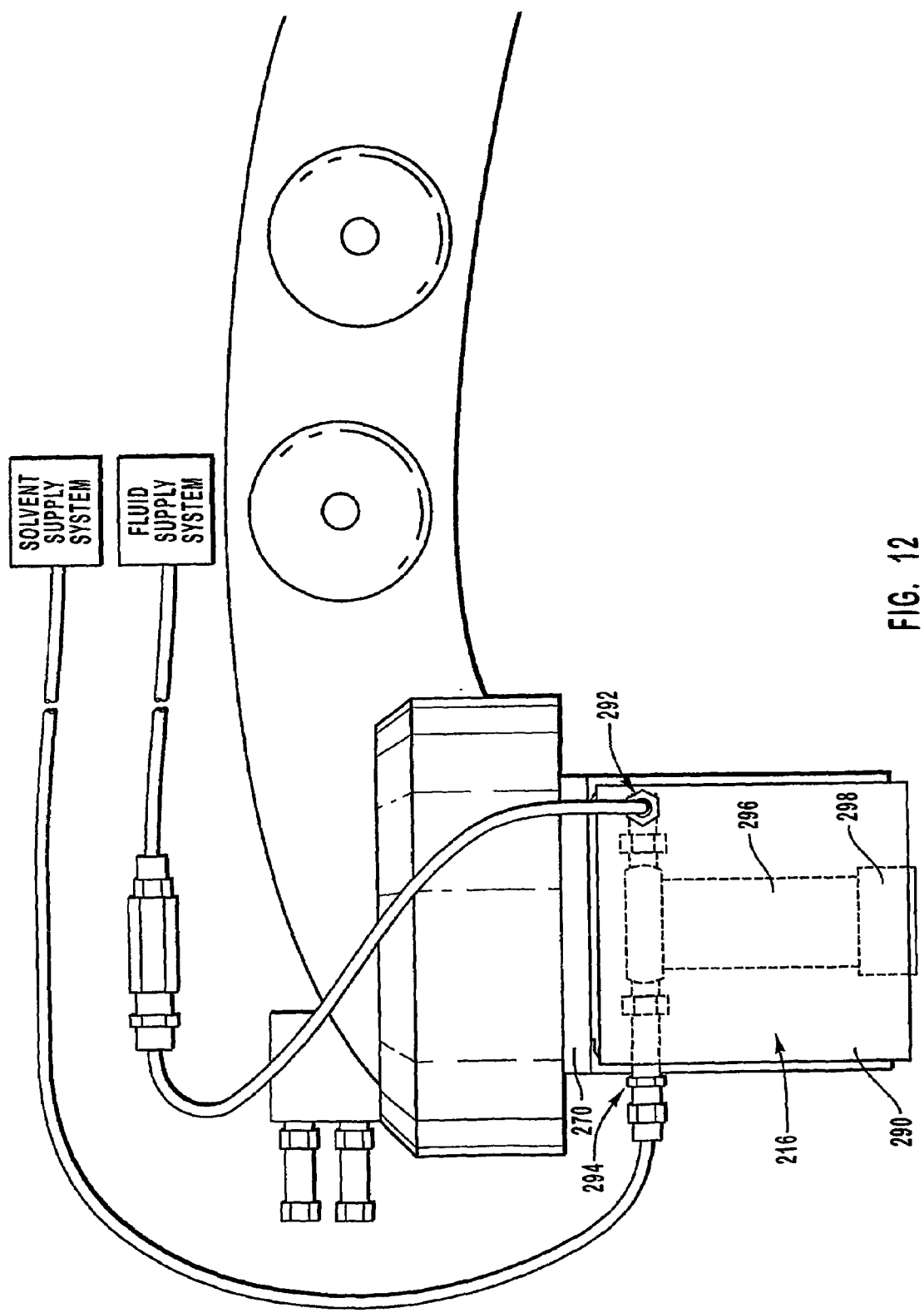
FIG. 12 illustrates a side view of the mounting bracket and PMD head support of FIG. 11 in which a PMD head has been mounted onto the mounting bracket and in which the tubing has been connected to the PMD head.

FIG. 12 illustrates a PMD head 216 connected with the mounting bracket 270. As shown, the PMD head 216 includes a housing 290, a fluid material inlet port 292, a solvent inlet port 294, internal PMD head components 296, and a nozzle assembly 298. During use, fluid material enters the PMD head 216 through the inlet port 292 and is channeled through the internal PMD head components 296 to the nozzle assembly 298 where it is finally discharged onto the substrate through the nozzles of the nozzle assembly 298.

According to one embodiment, the PMD head components 296 include a fluid material reservoir, a diaphragm, and a piezoelectric transducer, such as, for example a Lead Zirconate Titanate: Pb(Zr,Ti)O3, or "PZT" transducer which generates acoustic waves suitable for discharging the fluid material through the nozzles of the nozzle assembly 296. During use, the diaphragm and piezoelectric transducer generate acoustic pulses when power is supplied to the piezoelectric transducer. Droplets of the fluid material are discharged from the nozzle of the nozzle assembly 298 when the force of the acoustic pulses is sufficient to overcome the surface tension of the fluid material. The velocity and volume of the discharged droplets are controlled by altering the power supply to the piezoelectric transducer.

The PMD systems of the invention are capable of discharging fluid material in droplets having desired volumes, which can be as small as approximately 10 picoliters and at a frequency of up to thousands of droplets per second. The desired volume and frequency of the droplets is generally a function of the fluid material being deposited and the microstructure that is being formed. Accordingly, it should be appreciated that the invention is not limited to discharging droplets of fluid materials of any particular volume, frequency, or form.

The inventors have found that conventional ink jet heads ("jet heads") can be readily adapted for use with the fluid materials of the invention. Accordingly, the invention extends to the use of existing jet heads or jet heads that will be created in the future, including those manufactured currently or in the future by third parties and those that have been or will be manufactured for the purpose of jetting ink in ink jet printing systems.

Figure 13:
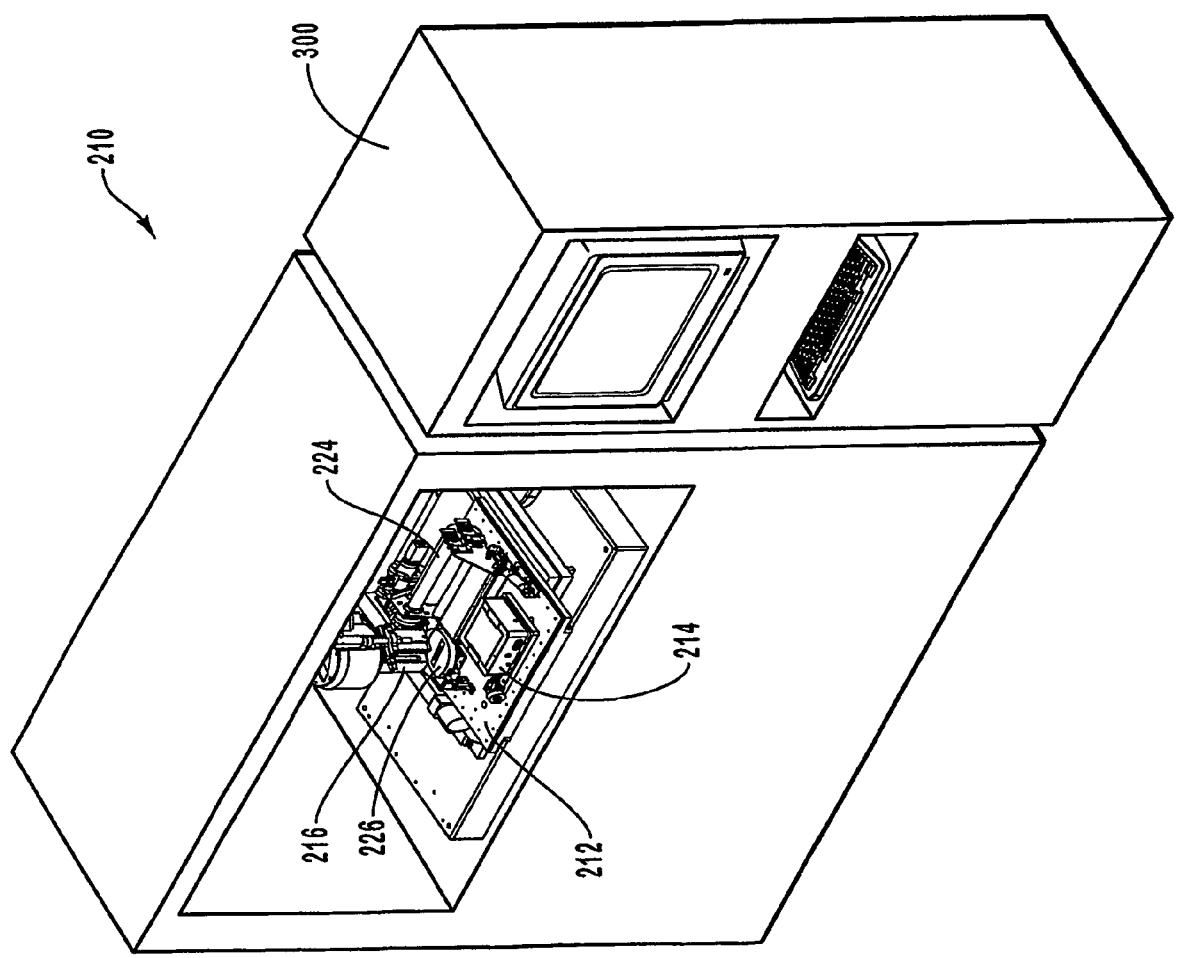
FIG. 13 illustrates one embodiment of the PMD system of the invention that includes a stand alone computer configured for controlling the PMD system and components.

According to one embodiment, the PMD systems 210 of the invention include a computer system configured to execute computer-executable instruction for generating various digital waveforms, current power supplies, and digital signals, as required by the various print head technologies. The computer system may be physically incorporated within the separate PMD system components, or alternatively, as shown in FIG. 13, the computer system may be embodied as a stand alone computer system 300 that is connected with each of the different PMD system components, thereby enabling an operator to control each of the PMD system components from the stand alone computer system, including the vacuum chuck.

Figure 14:
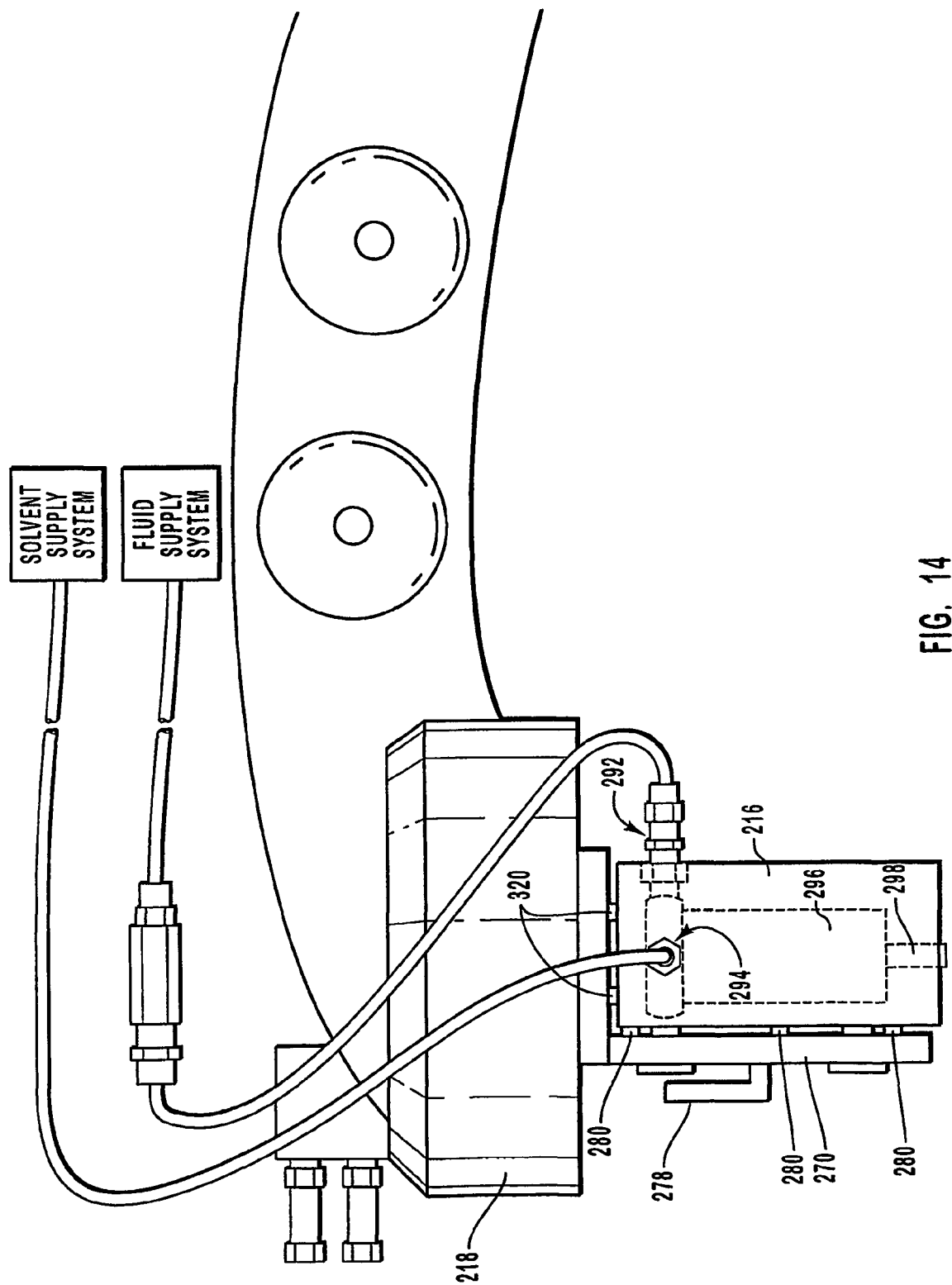
FIG. 14 illustrates the mounting bracket, PMD head, and PMD head support of FIG. 12 in which the mounting bracket and PMD head have been rotated on the PMD head support by 90°.

FIG. 14 also shows how the datum points 280 of the mounting bracket 270 can be biased against the PMD head 216 to ensure alignment. The datum points 280 preferably comprise hardened steel capable of providing exact alignment of the PMD head 216 with the mounting bracket 270. Additional datum points 320 may also be provided between the top surface of the PMD head 216 and the mounting bracket 270 for facilitating alignment of the PMD head 216 with the mounting bracket 270. Alignment of the PMD head 216 is important, as mentioned above, because of the precision required for certain PMD processes. If the PMD head 216 is not properly aligned, the drop angle of the nozzles could become undesirably offset. Accordingly, if misalignment is significant, it may be necessary to remount the PMD head 216 on the mounting bracket 270. Otherwise, the drop diagnostics assembly detects and compensates for any misalignment, as generally described above.

Attention will now be returned to FIG. 6 for providing a detailed description of the capping station 226. As shown, the capping station 226 generally includes a tray 330 mounted on an extendable support, and a soaking reservoir 334. One purpose of the capping station is to receive and bathe the nozzles of the PMD head 216 during periods of nonuse, to keep the nozzles from drying out and from becoming clogged. For instance, when the PMD head 216 is inactive for a period of time the capping station 226 is moved below the PMD head 216 and the tray 330 is elevated by the extendable support until the soaking reservoir 334 engages the nozzle assembly of the PMD head 216. The soaking reservoir 334 is filled with a solvent that is compatible with the fluid material and that keeps the nozzles from drying out. The soaking reservoir 334 can be supplied with the solvent by the PMD head 216 or by another supply means, such as with tubing connected directly with a solvent supply (not shown).

Another purpose of the capping station 226 is to catch any fluid material deposited from the PMD head 216 during drop diagnostics. For instance, during drop diagnostics, the fluid material can be dropped onto any portion of the tray 330. Excessive fluid material and solvent falling onto the tray 330 is disposed of through a drain 338 that is connected with the tray 330.

Attention is now directed to the maintenance station 224. The maintenance station 224 generally includes a roller assembly 370, a cushioned surface 372, and a blotting cloth 374. During use, the blotting cloth 374 is fed through the roller assembly 370 and over the top of the cushioned surface 372. When the PMD head requires servicing, such as when the nozzles become clogged or when fluid material accumulates on the nozzle assembly, the maintenance station 224 is moved below the PMD head with the cushioned surface 372 positioned directly beneath the PMD head. The cushioned surface 372 is then raised by a lifting mechanism, such as, for example, with the hydraulic lever assembly 376, until the blotting cloth 374 comes in contact with the nozzle assembly. The blotting cloth 374 is then fed through the roller assembly 370, frictionally engaging and cleaning the nozzles of the nozzle assembly. According to one embodiment, the blotting cloth comprises a nonabrasive material suitable for cleaning the nozzles without causing undue damage or wear to the nozzles. To minimize any potential for damage to the nozzles, the maintenance station 224 is configured with the cushioned surface 372 to absorb any impact that could possibly occur between the PMD head and the maintenance station 224.

The PMD systems of the invention have thus far been described as being capable of utilizing only a single PMD head at any given time. It will be appreciated, however, that the PMD systems of the invention can also be configured to simultaneously interoperate with multiple PMD heads. For example, the PMD system may be configured with multiple PMD head supports, each including a separate PMD head. The PMD head supports may also comprise linear bearing assemblies for enabling movement of the PMD head with respect to the substrate, although preferably not while depositing fluid material.

In summary, the invention, as it has been described herein, generally enables a vacuum chuck to securely hold a substrate in a desired alignment for receiving droplets of a fluid material. The vacuum chucks of the invention also enable control over the temperature of the substrate and fluid material for controlling the cure rate and resultant shape of the fluid material on the substrate.

In one embodiment, the vacuum chucks of the invention are used during PMD processes for controlling the cure rate of polymers during the manufacture of PLED displays. However, it will be appreciated that the invention is not limited to the use of any particular substrate or fluid material for the manufacture of any particular structure. Accordingly, the vacuum chucks of the invention can be used during the manufacture of LEDs, LCDs, CRTs, and other displays requiring the deposition of different fluid materials on a substrate. In other applications, the vacuum chucks of the invention are used to manufacture printed circuit board (PCB) structures, including traces, resistors, photo resists, and light guides. The vacuum chucks of the invention can also be used for securing substrates used for receiving bodily, organic, or synthetic fluids, DNA strands, vaccines, medicines, bacteria, viruses, and other products during testing or manufacture of said products.

Accordingly, the present claimed invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. A temperature controllable vacuum chuck, comprising:
   a mounting bracket having a base and sidewalls circumferentially extending around the base, the mounting bracket defining an open top and a cavity;
   a porous plate connected with the mounting bracket within the cavity, said porous plate having a top surface against which a substrate capable of receiving fluid manufacturing material is secured when negative air pressure exists within the cavity and a bottom surface;
   means for creating a negative air pressure within the cavity; and means for controlling the temperature of the porous plate including a heater element which is disposed against the bottom surface of said porous plate by a pressure plate.

2. A vacuum chuck as recited in claim 1, wherein the heater element comprises a flexible heater.

3. A vacuum chuck as recited in claim 2, wherein the flexible heater comprises a foil heater.

4. A vacuum chuck as recited in claim 1, wherein the pressure plate is pressed against the heater element by at least one adjustable sliding block assembly.

5. A vacuum chuck as recited in claim 1, wherein the means for controlling the temperature of the porous plate further includes a temperature sensor configured to measure the temperature of the porous plate.

6. A vacuum chuck as recited in claim 5, wherein the temperature sensor comprises a resistance temperature detector.

7. A vacuum chuck as recited in claim 1, wherein means for creating negative air pressure within the cavity comprises a vacuum.

8. A vacuum chuck as recited in claim 7, wherein the vacuum is configured to suction air out from the cavity through a hole existing in the mounting bracket.

9. A vacuum chuck as recited in claim 1, wherein the porous plate is configured to securely mount a substrate in a fixed location on the porous plate when negative air pressure exists within the cavity.

10. A vacuum chuck as recited in claim 9, wherein the porous plate is metal.

11. A vacuum chuck as recited in claim 10, wherein the porous plate comprises aluminum.

12. A temperature controllable vacuum chuck, comprising:
 a mounting bracket having a base and sidewalls circumferentially extending around the base, the mounting bracket defining an open top and a cavity;
 a porous plate having a top surface and a bottom surface connected with the mounting bracket, wherein the porous plate is mounted within the cavity and is configured to securely mount a substrate against the top surface of the porous plate when negative air pressure exists within the cavity, and wherein the substrate is configured to receive a fluid manufacturing material during a piezoelectric microdeposition process;
 means for creating a negative air pressure within the cavity; and
 means for controlling the cure rate of the fluid manufacturing material received on the substrate.

13. A vacuum chuck as recited in claim 12, wherein means for controlling the cure rate of the fluid manufacturing material comprises a heating element.

14. A vacuum chuck as recited in claim 13, wherein the heating element is configured to controllably heat the porous plate to a desired temperature.

15. A vacuum chuck as recited in claim 14, wherein the desired temperature of the porous plate is greater than an existing temperature of the substrate, such that when the substrate is mounted on the porous plate heat is conducted from the porous plate to the substrate and the existing temperature of the substrate is raised to the desired temperature.

16. A vacuum chuck as recited in claim 15, wherein raising the existing temperature of the substrate to the desired temperature enables the fluid manufacturing material to cure at a desired rate.

17. A vacuum chuck as recited in claim 14, wherein the desired temperature of the porous plate is less than the temperature of the substrate, such that when the substrate is mounted on the porous plate heat is conducted from the substrate to the vacuum chuck and diffused by the vacuum chuck such that the temperature of the substrate is lowered to the desired temperature.

18. A vacuum chuck as recited in claim 17, wherein lowering the temperature of the substrate to the desired temperature enables the fluid manufacturing material to cure at a desired rate.

19. A vacuum chuck as recited in claim 14, wherein the desired temperature of the porous plate is the same as the temperature of the substrate, such that when the substrate is mounted on the porous plate the porous plate enables the substrate to maintain the desired temperature.

20. A temperature controllable vacuum chuck, comprising:
 a mounting bracket having a base and sidewalls circumferentially extending around the base, the mounting bracket defining an open top and a cavity;
 a porous plate connected with the mounting bracket within the cavity, said porous plate having a top surface against which a substrate capable of receiving fluid manufacturing material is secured when negative air pressure exists within the cavity;
 a vacuum source configured to create a negative air pressure within the cavity by suctioning air out from the cavity through a hole existing in the mounting bracket;
 a heating source mounted within the cavity and configured for heating the porous plate; and
 a plurality of temperature sensors configured to independently measure temperatures of the porous plate at different locations on the porous plate.

21. A vacuum chuck as recited in claim 20, wherein the heating source is configured for uniformly heating the porous plate.

22. A vacuum chuck as recited in claim 20, wherein the plurality of temperature sensors comprises two resistance temperature detectors configured to measure the temperate of the porous plate at a central location of the porous plate and at a perimeter location of the porous plate.

23. A temperature controllable vacuum chuck, comprising:
 a mounting bracket having a base and sidewalls circumferentially extending around the base, the mounting bracket defining an open top and a cavity;
 a porous plate connected with the mounting bracket within the cavity, said porous plate having a top surface against which a substrate capable of receiving fluid manufacturing material is secured when negative air pressure exists within the cavity;
 a vacuum source configured to create a negative air pressure within the cavity by suctioning air out from the cavity through a hole existing in the mounting bracket;
 a heating source mounted within the cavity and configured for heating the porous plate;
 a sensor connected with the porous plate and configured for determining the temperature of the porous plate; and
 a temperature control component connected with the heating source and the sensor and configured to adjust an amount of heat generated by the heating source.

24. A vacuum chuck as recited in claim 23, wherein the temperature control component enables a user to control the temperature of the porous plate.

25. A vacuum chuck as recited in claim 24, wherein the temperature control component enables the user to control the temperature of the porous plate within about 0.5 degrees Fahrenheit.

26. A vacuum chuck as recited in claim 24, wherein the temperature control component enables a user to control the temperature of the porous plate while the vacuum source creates a negative air pressure within the cavity.

27. A vacuum chuck as recited in claim 23, wherein the temperature sensor is biased directly against the porous plate.

28. A vacuum chuck as recited in claim 27, wherein a spring biases the temperature sensor directly against the porous plate.

29. A temperature controllable vacuum chuck, comprising:
- a mounting bracket having a base and sidewalls circumferentially extending around the base, the mounting bracket defining a cavity and an open top;
- a porous plate having a top surface and a bottom surface, wherein the porous plate is slidably mounted within the cavity of the mounting bracket;
- a vacuum source configured to create a negative pressure within the cavity by suctioning air out from the cavity through a hole existing in the mounting bracket;
- a heating source mounted to the bottom surface of the porous plate within the cavity, wherein the heating source is configured to heat the porous plate;
- means for adjusting the porous plate within the cavity; and
- means for retaining the porous plate within the cavity.

30. A vacuum chuck as recited in claim 29, wherein the means for adjusting the porous plate within the cavity comprises a sliding block assembly, the sliding block assembly including:
- a pressure plate configured to uniformly apply pressure to the bottom of the heating source, wherein said pressure causes the mounting bracket and the heating source to move upwards within the mounting bracket until the porous plate is obstructed by the means for retaining the porous plate within the cavity;
- a first block having an angled surface, wherein the first block is securely affixed to the mounting bracket; and
- a second block slidably disposed between the angled surface of the first block and the pressure plate, wherein the second block is configured to controllably slide up and down the angled surface.

31. A vacuum chuck as recited in claim 30, wherein means for retaining the porous plate within the cavity comprises a retaining ridge protruding away from the open top.

32. A vacuum chuck as recited in claim 31, wherein an O-ring seals the porous plate to the mounting bracket.

33. A vacuum chuck as recited in claim 29, further comprising means for aligning a substrate on the porous plate.

34. A vacuum chuck as recited in claim 33, wherein means for aligning a substrate on the porous plate comprises an alignment ridge protruding away from the mounting bracket.

\* \* \* \* \*